(12) United States Patent
Teno

(10) Patent No.: US 9,595,348 B2
(45) Date of Patent: Mar. 14, 2017

(54) MEMORY CIRCUIT THAT UPDATES AND HOLDS OUTPUT SIGNAL BASED ON FUSE SIGNAL

(71) Applicant: Rohm Co., Ltd., Kyoto (JP)

(72) Inventor: Yoshihiro Teno, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 0 days.

(21) Appl. No.: 14/809,379

(22) Filed: Jul. 27, 2015

(65) Prior Publication Data
US 2016/0035435 A1  Feb. 4, 2016

(30) Foreign Application Priority Data

Jul. 30, 2014  (JP) .................. 2014-154529

(51) Int. Cl.
| | | |
|---|---|---|
| G11C 17/00 | (2006.01) | |
| G11C 17/18 | (2006.01) | |
| G11C 17/16 | (2006.01) | |
| G11C 14/00 | (2006.01) | |

(52) U.S. Cl.
CPC .............. *G11C 17/18* (2013.01); *G11C 14/00* (2013.01); *G11C 17/16* (2013.01)

(58) Field of Classification Search
CPC .......... G11C 17/18; G11C 14/00; G11C 17/16
USPC .................. 365/96, 189.12, 225.7
See application file for complete search history.

(56) References Cited

U.S. PATENT DOCUMENTS 6,373,760 B1 * 4/2002 Ohbayashi ........... G11C 29/785
                                                    365/156

FOREIGN PATENT DOCUMENTS

| JP | 2013-058875 | 3/2013 | |
| JP | 2013058875 | * 3/2013 | ............... H03K 5/00 |

* cited by examiner

*Primary Examiner* — Tha-O H Bui
(74) *Attorney, Agent, or Firm* — Fish & Richardson P.C.

(57) ABSTRACT

A memory circuit includes: a control part configured to output a control signal; a fuse circuit which is driven by the control signal and is configured to output a fuse signal whose signal level is determined based on a state of a first fuse element; and a holding circuit configured to update and hold a signal based on the fuse signal in response to the control signal output from the control part and output the held signal as an output signal.

16 Claims, 14 Drawing Sheets

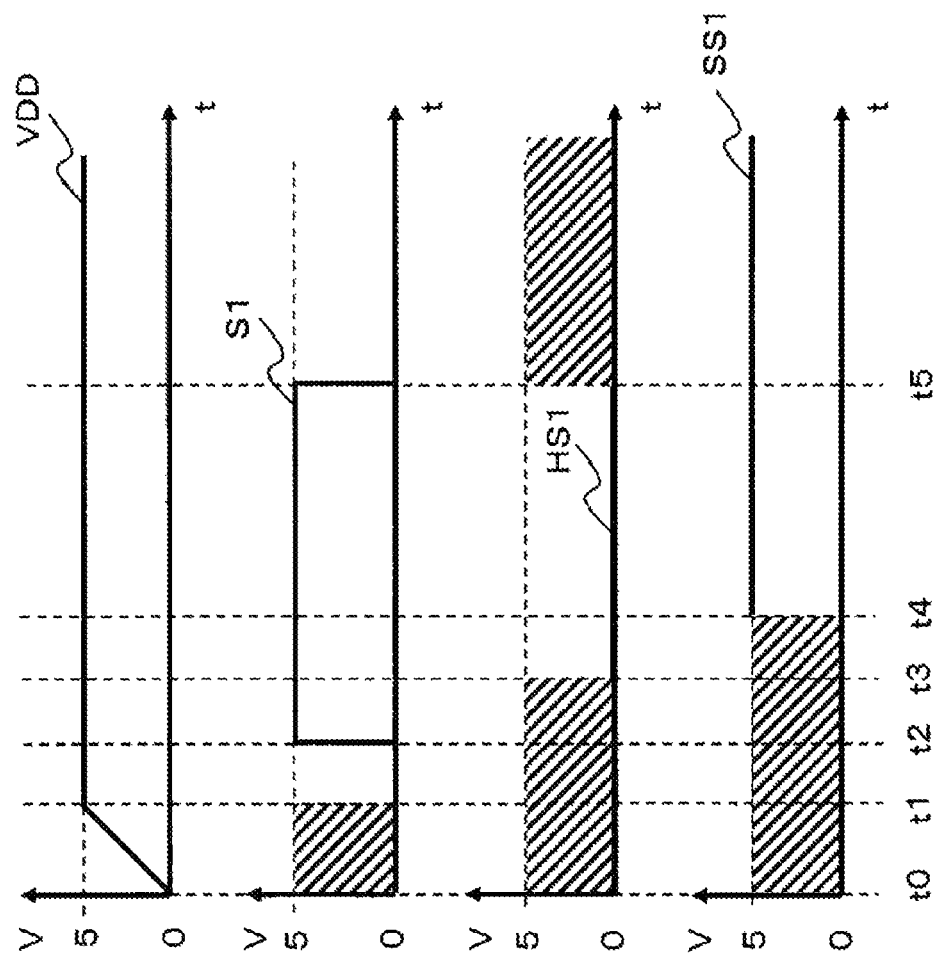

10e

MEMORY CIRCUIT THAT UPDATES AND HOLDS OUTPUT SIGNAL BASED ON FUSE SIGNAL

CROSS-REFERENCE TO RELATED APPLICATION

This application is based upon and claims the benefit of priority from Japanese Patent Applications No. 2014-154529, filed on Jul. 30, 2014, the entire contents of which are incorporated herein by reference.

TECHNICAL FIELD

The present disclosure relates to a memory circuit including a fuse circuit that determines an output signal level based on a disconnect state of a fuse element, and a latch circuit that holds a signal level based on a fuse signal output from the fuse circuit.

BACKGROUND

In general, there has been known a memory circuit including a fuse circuit that determines an output signal level based on a disconnect state of a fuse element, and a latch circuit that holds a signal level based on a fuse signal output from the fuse circuit.

FIG. 13 is a schematic view illustrating a conventional memory circuit 20. The memory circuit 20 includes a transistor P11, a resistive element R11, a fuse element H11, a transistor N11 and a latch circuit L11.

The transistor P11 has a source terminal S connected to a power supply VDD. The resistive element R11 has one end connected to a drain terminal D of the transistor P11. The fuse element H11 has one end connected to the other end of the resistive element R11. The transistor N11 has a drain terminal D connected to the other end of the fuse element H11 and a source terminal S connected to a power source VSS. Here, an electric potential of a node Nd11 at the connection point between the fuse element H11 and the resistive element R11 is output, as a fuse signal HS11, to the latch circuit L11. The latch circuit L11 holds the fuse signal HS11 in response to an input control signal S11 and outputs a signal level of the fuse signal HS11 as an output signal SS11.

FIGS. 14A to 14D illustrate signal waveforms in the memory circuit 20 as time passes, in a case where the fuse element H11 is disconnected under an output determination mode of determining a signal level of the output signal SS11 of the memory circuit 20. FIG. 14A illustrates transition of a voltage level of the power supply VDD. FIG. 14B is a signal waveform of the fuse signal HS11. FIG. 14C is a signal waveform of the control signal S11. FIG. 14D is a signal waveform of the output signal SS11. In each of FIGS. 14A to 14D, a vertical axis represents a signal level V and a horizontal axis represents time t. Times t30 to t34 are indicated as common time in FIGS. 14A to 14D. A shaded portion indicates a period in which it is uncertain whether an electric potential has a low level or a high level.

At time t30, the power supply VDD is driven. At this point of time, the power supply VDD is at 0 V and the control signal S11 and the fuse signal HS11 have a low level and a signal level of the output signal SS11 is uncertain.

At time t31, the power supply VDD rises to a rated voltage of 5 V and the transistor P11 and the transistor N11 are turned on. At this point of time, since the fuse element H11 has been disconnected, the electric potential of the node Nd11 has substantially the same voltage level as the power supply VDD and the signal level of the fuse signal HS11 becomes high, for example, about 5 V. The signal level of the high level fuse signal HS11 is given as 5 V in FIG. 14B.

At time t32, the high level control signal S11 is input to the latch circuit L11 while the signal level of the fuse signal HS11 is maintained, and the latch circuit L11 latches (holds) the high level which is the signal level of the fuse signal HS11. Thus, the signal level of the output signal SS11 becomes high, for example, about 5 V. The signal level of the high level output signal SS11 is given as 5 V in FIG. 14D.

At time t33, the control signal S11 becomes a low level, and the latch circuit L11 stops updating the signal level of the fuse signal HS11 held in the latch circuit L11. Therefore, the output signal SS11 of the latch circuit L11 is held at the high level.

At time t34, i.e., after the control signal S11 becomes the low level and the output signal SS11 of the latch circuit L11 is held at the high level, the fuse signal HS11 becomes a low level. At this point of time, since the latch circuit L11 maintains the signal level held from time t32 to time t33 during which the signal level of the fuse signal HS11 was the high level, the output signal SS11 is held at the high level.

In the memory circuit 20 described with reference to FIGS. 13 and 14A to 14D, at time t32, the control signal S11 is input to the latch circuit L11 and the signal level of the fuse signal HS11 is held in the latch circuit L11. Thereafter, at time t33, the control signal S11 supplied to the latch circuit L11 becomes a low level and the latch circuit L11 stops updating the held signal level of the fuse signal HS11 held in the latch circuit L11. Thereafter, in order to prevent the output signal SS11 from being incorrectly held due to fluctuation of the fuse signal HS11, at time t34, i.e., after sufficient time elapses from the time when the control signal S11 became the low level, the fuse signal HS11 becomes a low level and the output determination mode is terminated. Therefore, since the output determination mode needs an additional time period A from time t33 to time t34, it takes long time for a product equipped with the memory circuit 20 to reach an actually usable state after being powered on.

SUMMARY

The present disclosure provides some embodiments of a memory circuit that allows a product equipped with the memory circuit to reach a usable state quickly after being powered on.

According to one embodiment of the present disclosure, there is provided a memory circuit including: a control part configured to output a control signal; a fuse circuit which is driven by the control signal and is configured to output a fuse signal whose signal level is determined based on a state of a first fuse element; and a holding circuit configured to update and hold a signal based on the fuse signal in response to the control signal output from the control part and output the held signal as an output signal.

BRIEF DESCRIPTION OF THE DRAWINGS

FIGS. 3A to 3D illustrate signal waveforms in the memory circuit 10a as time passes, in a case where a fuse element H1 is disconnected under an output determination mode.

DETAILED DESCRIPTION

Embodiments of the present disclosure will now be described with reference to the drawings. Numerical values, circuits and so on set forth in the following description can be appropriately selected without departing from the spirit and scope of the present disclosure.

Figure 1:
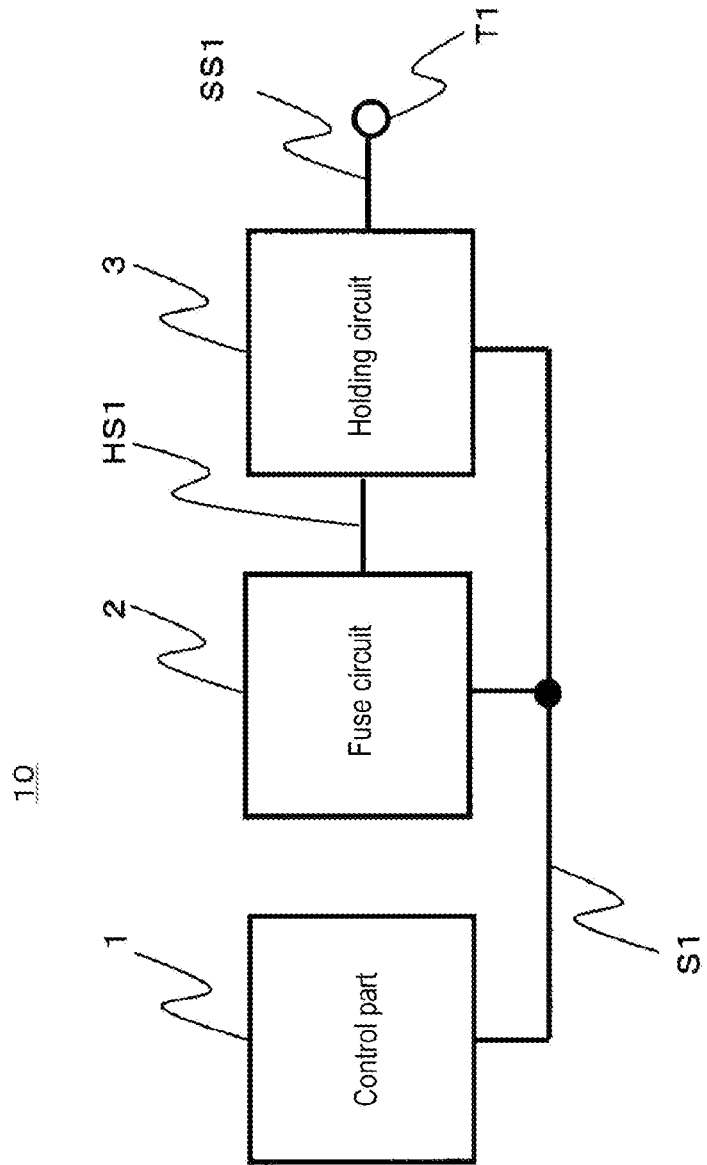
FIG. 1 is a schematic view illustrating a common configuration in various embodiments of a memory circuit 10 according to the present disclosure.

FIG. 1 is a schematic view illustrating a common configuration in various embodiments of a memory circuit 10 according to the present disclosure. The memory circuit 10 includes a control part 1, a fuse circuit 2 and a holding circuit 3.

The control part 1 is connected to the fuse circuit 2 and the holding circuit 3 and outputs a control signal S1 to the fuse circuit 2 and the holding circuit 3. The fuse circuit 2 includes a fuse element and is driven, i.e., controlled in terms of its circuit operation, by the control signal S1 output from the control part 1. The fuse circuit 2 outputs a fuse signal HS1 whose signal level is determined based on a state of the fuse element included in the fuse circuit 2. The holding circuit 3 holds, in response to the control signal S1 output from the control part 1, a signal based on the fuse signal HS1 and outputs the held signal as an output signal SS1.

First Embodiment

Figure 2:
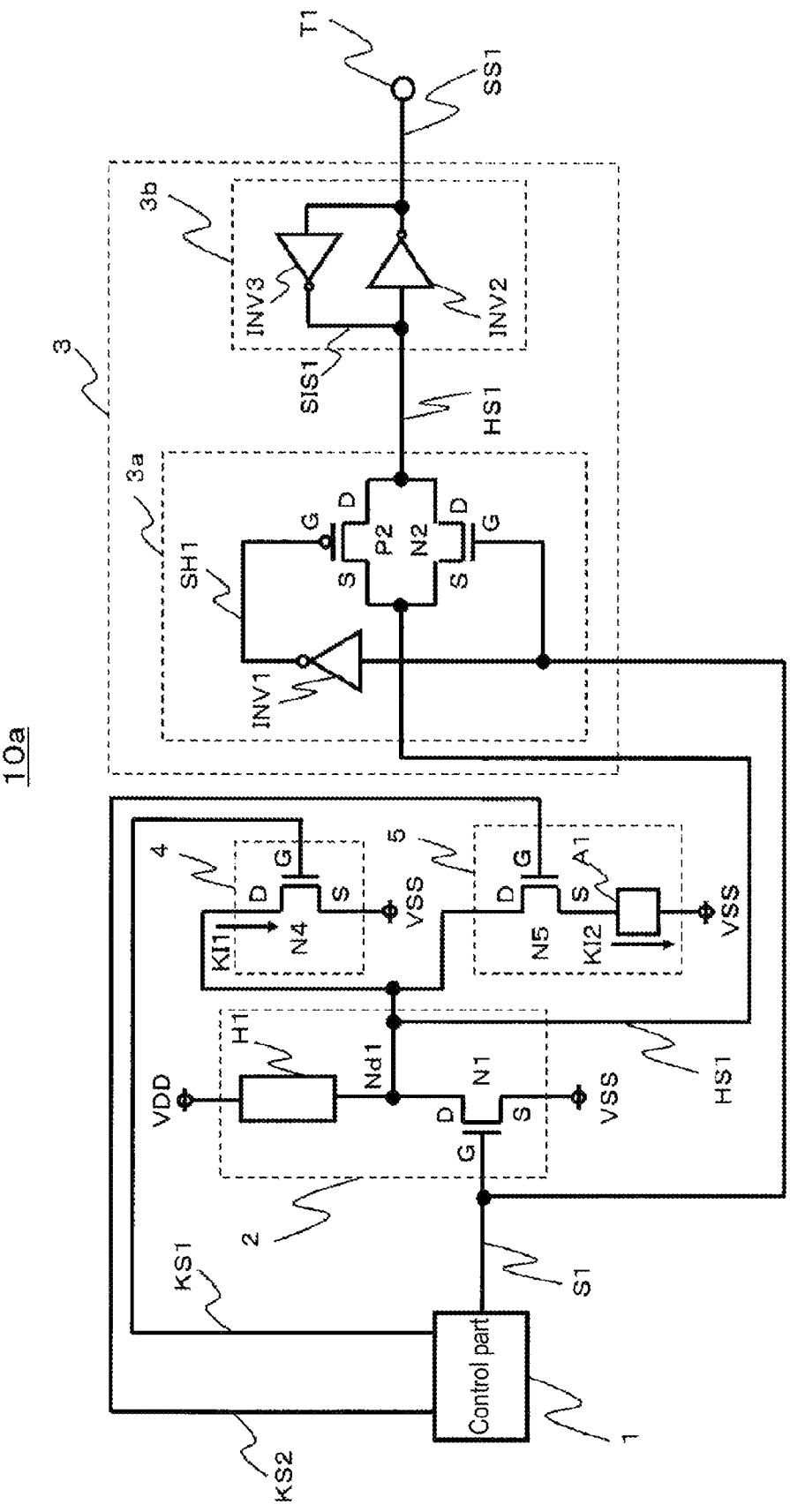
FIG. 2 is a circuit diagram of a memory circuit 10a according to a first embodiment of the present disclosure.

FIG. 2 is a circuit diagram of a memory circuit 10a according to a first embodiment of the present disclosure. The memory circuit 10a includes a control part 1, a fuse circuit 2, a holding circuit 3, a write control part 4 and a write verification part 5. In the memory circuit 10a illustrated in FIG. 2, the same elements as those in the memory circuit 10 illustrated in FIG. 1 are denoted by the same reference numerals and explanation of which will not be repeated as appropriate.

The fuse circuit 2 includes a fuse element H1 as a first fuse element, and a transistor N1 as a first switching element. The fuse element H1 has one end connected to a power supply VDD as a first power supply of, for example, 5 V. When the fuse element H1 is not disconnected, i.e., before the fuse element H1 is disconnected, resistance across the fuse element H1 is 100Ω. On the other hand, when the fuse element H1 is disconnected, i.e., after the fuse element H1 is disconnected, resistance across the fuse element H1 is about 1 MΩ. The fuse element H1 is made of material generally used for a fuse element, for example, polysilicon or aluminum (Al).

The transistor N1, which is an NMOS transistor, has a drain terminal D connected to the other end of the fuse element H1, a source terminal S connected to a second power supply VSS of 0 V which is lower than that of the power supply VDD, and a gate terminal G serving as a control terminal connected to the control part 1. The transistor N1 is turned on and off based on a control signal S1 applied from the control part 1 to the gate terminal G, whereby the fuse circuit 2 is driven, i.e., the circuit operation is controlled. On-resistance of the transistor N1 is, for example, 10 kΩ. Here, a node at the connection point between the other end of the fuse element H1 and the transistor N1 is referred to as a node Nd1 as a first node.

The fuse circuit 2 is driven when the control signal S1 output from the control part 1 is applied to the gate terminal G of the transistor N1, and outputs the fuse signal HS1 whose signal level is determined based on a state of the fuse element H1 included in the fuse circuit 2. Here, the signal level of the fuse signal HS1 becomes an electric potential of the node Nd1, which is determined based on a magnitude relationship between the resistance of the fuse element H1 and the resistance of the transistor N1.

In the fuse circuit 2, when the fuse element H1 is disconnected, since the resistance across the fuse element H1 is about 1 MΩ and is higher than 10 kΩ which is the on-resistance across the transistor N1, the node Nd1 outputs the fuse signal HS1 of a low level at about 0 V. When the fuse element H1 is not disconnected, since the resistance across the fuse element H1 is 100Ω and is lower than 10 kΩ which is the on-resistance across the transistor N1, the node Nd1 outputs the fuse signal HS1 of a high level at about 5 V.

With the fuse circuit 2 according to this embodiment, since a signal level of the fuse signal HS1 is determined by the fuse element H1 connected to the power supply VDD and the transistor N1, which is connected to the power supply VSS and is constituted by an NMOS transistor for controlling the driving of the fuse circuit 2, it is not necessary to separately provide a PMOS transistor or a resistive element for determining the fuse signal HS1 and accordingly it is possible to suppress an increase in circuit area.

The holding circuit 3 holds the fuse signal HS1 based on the control signal S1 output from the control part 1 and outputs the held signal as the output signal SS1. The holding circuit 3 includes a holding control part 3a and a holding part 3b. The holding control part 3a performs transmission control to transmit the fuse signal HS1, which is output from the fuse circuit 2, to the holding part 3b based on the control signal S1. The holding part 3b holds a signal, which is based on the fuse signal HS1 and is transmitted from the holding control part 3a, and outputs the held signal as the output signal SS1.

The holding control part 3a includes an inverter INV1, a transistor N2 as a first control switch, and a transistor P2 as the first control switch. The inverter INV1 has an input terminal connected to the control part 1. The inverter INV1 receives the control signal S1 from the control part 1 and outputs a control inverted signal SH1 generated by inverting a signal level of the control signal S1 through an output terminal. The transistor N2, which is an NMOS transistor, has a source terminal S connected to the node Nd1 of the fuse circuit 2 and a gate terminal G as a control terminal connected to the control part 1. The transistor N2 is turned on and off based on the control signal S1 input from the control part 1. The transistor P2, which is a PMOS transistor, has a source terminal S connected to the source terminal S of the transistor N2 and the node Nd1, a drain terminal D connected to a drain terminal of the transistor N2, and a gate terminal G as a control terminal connected to the output terminal of the inverter INV1. The transistor P2 is turned on and off based on the control inverted signal SH1 input from the inverter INV1, in other words, based on the control signal S1.

Although the holding control part 3a is configured to include the transistor N2, the transistor P2 and the inverter INV1 in this embodiment, the present disclosure is not limited to this configuration. For example, the holding control part 3a may be constituted by only an NMOS transistor having a drain terminal connected to the node Nd1 and a gate terminal connected to the control part 1. Without being limited thereto, in other configurations, the holding control part 3a may perform transmission control of transmitting a signal based on the fuse signal HS1 to the holding part 3b, based on the control signal S1.

Here, since the control signal S1 is input to the gate terminal G of the transistor N2 and, at the same time, the control inverted signal SH1 generated by inverting the signal level of the control signal S1 by means of the inverter INV1 is input to the gate terminal G of the transistor P2, the transistor P2 and the transistor N2 are turned on and off at once based on the control signal S1.

The holding part 3b includes an inverter INV2 and an inverter INV3. The inverter INV2 has an input terminal to receive the fuse signal HS1 output from the holding control part 3a. The inverter INV2 generates the output signal SS1 by inverting the signal level of the fuse signal HS1 input to the input terminal and outputs the generated output signal SS1 to an output terminal T1. The inverter INV3 has an input terminal connected to the output terminal of the inverter INV2. The inverter INV3 generates an output inverted signal SIS1 by inverting a signal level of the output signal SS1 input to the input terminal and outputs the generated output inverted signal SIS1 through an output terminal.

The input terminal of the inverter INV2 is connected to the output terminal of the inverter INV3. The inverter INV2 inverts the output inverted signal SIS1 input to the input terminal and outputs the output signal SS1. Due to a latch circuit constituted by the inverter INV2 and the inverter INV3, even when the transistor N2 and the transistor P2 are turned off, the holding part 3b is in a state of holding the output signal SS1 having a signal level based on the fuse signal HS1.

The write control part 4 is constituted by a transistor N4 as a first NMOS transistor. The transistor N4 has a drain terminal D connected to the node Nd1, a gate terminal G connected to the control part 1, and a source terminal S connected to the power supply VSS. The transistor N4 is turned on and off based on a write control signal KS1 input from the control part 1 to the gate terminal G. When the transistor N4 is turned on, a write current KI1 is flown from the power supply VDD into the fuse element H1 and the fuse element H1 is disconnected in response to a current value controlled by the transistor N4. In other words, the transistor N4 performs control for disconnecting the fuse element H1 by flowing the write current KI1 into the fuse element H1.

Here, since the transistor N4 is connected to the other end of the lower potential side of the fuse element H1, it is possible to use an NMOS transistor in the write control part 4. It is known that, in general, the size of an NMOS transistor is ½ to ⅓ of the size of a PMOS transistor for the same current capacity. Therefore, with the above circuit configuration, it is possible to suppress an increase in area of the memory circuit.

The write verification part 5 includes a transistor N5 as a second NMOS transistor and a current measuring means A1. The transistor N5 has a drain terminal D connected to the node Nd1 and a gate terminal G connected to the control part 1. The current measuring means A1 has one end connected to a source terminal S of the transistor N5 and the other end connected to the power supply VSS. The transistor N5 is turned on and off based on a write verification control signal KS2 input from the control part 1 to the gate terminal G of the transistor N5. When the transistor N5 is turned on, a verification current KI2 is flown from the power supply VDD into the current measuring means A1 via the fuse element H1 and the transistor N5. By measuring a current value of the verification current KI2 at the current measuring means A1, it is possible to verify a disconnect state of the fuse element H1. An example of the current measuring means A1 may include am ammeter or a resistive element which is known in the art.

FIGS. 3A to 3D illustrate signal waveforms in the memory circuit 10a as time passes, in a case where the fuse element H1 is disconnected under an output determination mode of determining a signal level of the output signal SS1 of the memory circuit 10a illustrated in FIG. 2. FIG. 3A illustrates transition of a voltage level of the power supply VDD. FIG. 3B is a signal waveform of the control signal S1. FIG. 3C is a signal waveform of the fuse signal HS1. FIG. 3D is a signal waveform of the output signal SS1. In each of FIGS. 3A to 3D, a vertical axis represents a signal level V and a horizontal axis represents time t. Times t0 to t5 are indicated as common time in FIGS. 3A to 3D. Shaded portions indicate periods in which it is uncertain whether an electric potential has a low level or a high level.

At time t0, the power supply VDD is driven. At this point of time, since he power supply VDD is at 0 V, the fuse signal HS1 output from the fuse circuit 2 driven by the voltage of the power supply VDD and the output signal SS1 determined based on the signal level of the fuse signal HS1 are both uncertain.

At time t1, when the voltage level of the power supply VDD rises and is stabilized at 5 V, the control signal S1 of a low level at about 0 V is output from the control part 1. The control signal S1 of the low level is supplied to the gate terminal G of the transistor N1 and the gate terminal G of the transistor N2 of the fuse circuit 2, thereby turning off the transistor N1 and the transistor N2. In addition, the control signal S1 of the low level is supplied to the input terminal of the inverter INV1. Accordingly, the control inverted signal SH1 of a high level at about 5 V is output from the inverter INV1 and is supplied to the gate terminal G of the transistor P2, thereby turning off the transistor P2.

At time t2, that is, after the power supply VDD is stabilized at a predetermined electric potential, the control signal S1 of a high level at about 5 V is output from the control part 1. The transistor N1 is turned on upon receiving the control signal S1 of the high level at its gate terminal G, thereby driving the fuse circuit 2. In addition, the transistor N2 is turned on upon receiving the control signal S1 of the high level at its gate terminal G, and the transistor P2 is turned on upon receiving the control inverted signal SH1 of a low level at its gate terminal G from the inverter INV1 supplied with the control signal S1 of the high level.

Here, since the fuse circuit 2 has the resistance of about 1 MΩ as the fuse element H1 is disconnected, when the transistor N1 having the on-resistance of 10 kΩ is turned on, the electric potential of the node Nd1 gradually approaches to the electric potential of the power supply VSS.

At time t3, the electric potential of the node Nd1 becomes about 0 V and the fuse signal HS1 of a low level is output from the fuse circuit 2. Here, since the transistor N2 and the transistor P2 of the holding control part 3a are both turned on, the fuse signal HS1 is transmitted to the holding part 3b. Thus, the fuse signal HS1 of the low level is input to the inverter INV2.

At time t4, the fuse signal HS1 of the low level input to the inverter INV2 is inverted and the output signal SS1 of a high level is output from the inverter INV2. Thus, the electric potential of the output terminal T1 has a high level. Here, since the output signal SS1 is also input to the inverter INV3, the output inverted signal SIS1 of a low level is output from the inverter INV3. The output inverted signal SIS1 is input to the input terminal of the inverter INV2.

At time t5, the control signal S1 is switched from the high level to the low level. Thus, the transistor N1 is turned off to stop the driving of the fuse circuit 2 and accordingly stop the output of the fuse signal HS1. At the same time when the output of the fuse signal HS1 is stopped, the transistor N2 and the transistor P2 of the holding control part 3a are turned off to stop the supply of the fuse signal HS1 from the fuse circuit 2 to the holding part 3b, and accordingly the holding circuit 3 stops updating the fuse signal HS1 held in the holding circuit 3. At this time, since the holding part 3b maintains, using the inverter INV2 and the inverter INV3, the signal level based on the fuse signal HS1 input to the holding part 3b while the fuse circuit 2 is driven, the holding part 3b continues to maintain the output signal SS1 of the high level. Thus, the output signal SS1 is determined and the output determination mode is terminated. The update of the fuse signal HS1 held in the holding circuit 3 refers to holding the signal level based on the latest fuse signal HS1 output from the fuse circuit 2 in the holding circuit 3. The stop of updating the fuse signal HS1 held in the holding circuit 3 refers to holding, in the holding circuit 3, the signal level based on the fuse signal HS1 input to the holding circuit 3 at a time when the supply of the control signal S1 is stopped, and not newly holding a signal level based on the fuse signal HS1 subsequently input to the holding circuit 3.

Figures 4A, 4B, 4C, 4D:
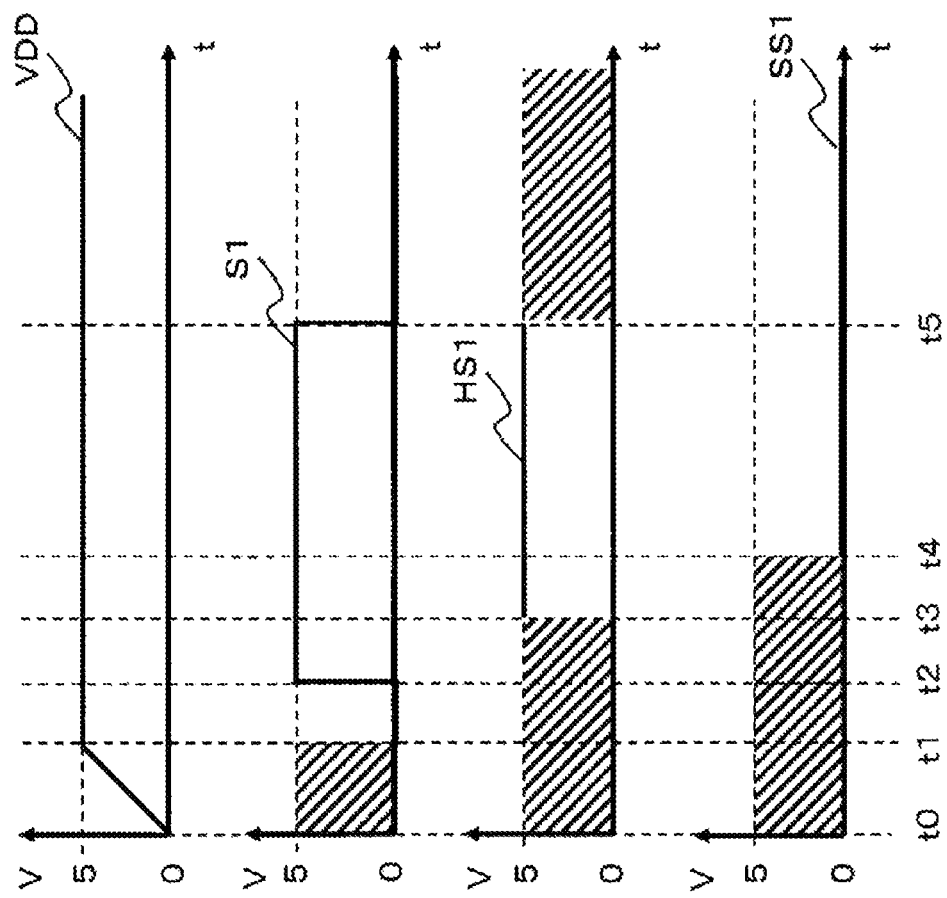
FIGS. 4A to 4D illustrate signal waveforms in the memory circuit 10a as time passes, in a case where the fuse element H1 is not disconnected under the output determination mode.

FIGS. 4A to 4D illustrate signal waveforms in the memory circuit 10a as time passes, in a case where the fuse element H1 is not disconnected under the output determination mode of determining a signal level of the output signal SS1 of the memory circuit 10a illustrated in FIG. 2. FIG. 4A illustrates transition of a voltage level of the power supply VDD. FIG. 4B is a signal waveform of the control signal S1. FIG. 4C is a signal waveform of the fuse signal HS1. FIG. 4D is a signal waveform of the output signal S11. In each of FIGS. 4A to 4D, a vertical axis represents a signal level V and a horizontal axis represents time t. Times t0 to t5 are indicated as common time in FIGS. 4A to 4D. Shaded portions indicate periods in which it is uncertain whether an electric potential has a low level or a high level.

At time t0, the power supply VDD is driven. At this point of time, since the power supply VDD is at 0 V, the fuse signal HS1 output from the fuse circuit 2 driven by the voltage of the power supply VDD and the output signal SS1 determined based on the signal level of the fuse signal HS1 are both uncertain.

At time t1, when the voltage level of the power supply VDD rises and is stabilized at 5 V, the control signal S1 of a low level at about 0 V is output from the control part 1. The control signal S1 of the low level is supplied to the gate terminal G of the transistor N1 and the gate terminal G of the transistor N2 of the fuse circuit 2, thereby turning off the transistor N1 and the transistor N2. In addition, the control signal S1 of the low level is supplied to the input terminal of the inverter INV1. Accordingly, the control inverted signal SH1 of a high level at about 5 V is output from the inverter INV1 and is supplied to the gate terminal G of the transistor P2, thereby turning off the transistor P2.

At time t2, that is, after the power supply VDD is stabilized at a predetermined electric potential, the control signal S1 of a high level at about 5 V is output from the control part 1. The transistor N1 is turned on upon receiving the control signal S1 of the high level at its gate terminal G, thereby driving the fuse circuit 2. In addition, the transistor N2 is turned on upon receiving the control signal S1 of the high level at its gate terminal G, and the transistor P2 is turned on upon receiving the control inverted signal SH1 of a low level at its gate terminal G from the inverter INV1 supplied with the control signal S1 of the high level.

Here, since the fuse circuit 2 has the resistance of about 100Ω as the fuse element H1 is not disconnected, when the transistor N1 having the on-resistance of 10 kΩ is turned on, the electric potential of the node Nd1 begins to rise as the node Nd1 receives the voltage of the power supply VDD from the point of time t2.

At time t3, the electric potential of the node Nd1 becomes about 5 V and the fuse signal HS1 of a high level is output from the fuse circuit 2. Here, since the transistor N2 and the transistor P2 of the holding control part 3a are both turned on, the fuse signal HS1 is transmitted to the holding part 3b. Thus, the fuse signal HS1 of the high level is input to the inverter INV2.

At time t4, the fuse signal HS1 of the high level input to the inverter INV2 is inverted and the output signal SS1 of a low level is output from the inverter INV2. Thus, the electric potential of the output terminal T1 has a low level. Here, since the output signal SS1 is also input to the inverter INV3, the output inverted signal SIS1 of a high level is output from the inverter INV3. The output inverted signal SIS1 is input to the input terminal of the inverter INV2.

At time t5, the control signal S1 is switched from the high level to the low level. Thus, the transistor N1 is turned off to stop the driving of the fuse circuit 2 and accordingly stop the output of the fuse signal HS1. At the same time when the output of the fuse signal HS1 is stopped, the transistor N2 and the transistor P2 of the holding control part 3a are turned off to stop the supply of the fuse signal HS1 from the fuse circuit 2 to the holding part 3b, and accordingly the holding circuit 3 stops updating the fuse signal HS1 held in the holding circuit 3. At this time, since the holding part 3b maintains, using the inverter INV2 and the inverter INV3, the signal level based on the fuse signal HS1 input to the holding part 3b while the fuse circuit 2 is driven, the holding part 3b continues to maintain the output signal SS1 of the low level. Thus, the output signal SS1 is determined and the output determination mode is terminated.

As described above, with the memory circuit 10a according to the first embodiment of the present disclosure, the transistor N1 for controlling the driving of the fuse circuit 2 and the transistors N2 and P2 of the holding control part 3a are turned on and off at once based on the control signal S1 output from the control part 1. Therefore, it is possible to perform the driving or stop of the fuse circuit 2 and the transmission control of the holding control part 3a at the same time. Accordingly, it is possible to terminate the output determination mode with the fuse signal HS1 set to the low level without an interval of time after determining the output signal SS1 of the holding part 3b. As a result, it is possible to suppress an increase in time required for the output determination mode and further quickly use a product equipped with the memory circuit 10a after being powered on.

Second Embodiment

Figure 5:
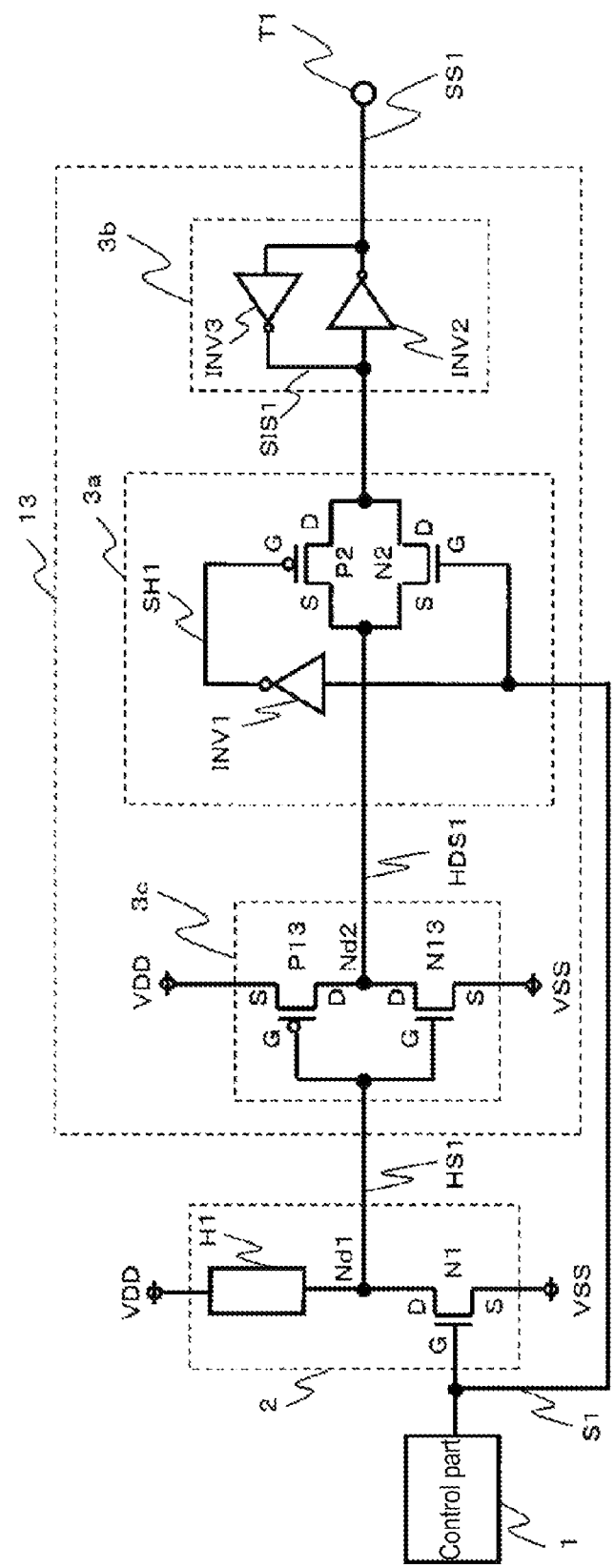
FIG. 5 is a circuit diagram of a memory circuit 10b according to a second embodiment of the present disclosure.

FIG. 5 is a circuit diagram illustrating a memory circuit 10b according to a second embodiment of the present disclosure. The memory circuit 10b includes a control part 1, a fuse circuit 2 and a holding circuit 13. The memory circuit 10b of the second embodiment is different from the memory circuit 10a of the first embodiment in that the holding circuit 13 is replaced for the holding circuit 3 and particularly, in that the holding circuit 13 further includes a buffer part 3c in comparison with the holding circuit 3. In the memory circuit 10b illustrated in FIG. 5, the same elements as those in the memory circuits 10 and 10a illustrated in FIGS. 1 and 2 are denoted by the same reference numerals and explanation of which will not be repeated as appropriate. The write control part 4 and the write verification part 5 are omitted for the convenience of drawing.

The holding circuit 13 holds a signal level based on the fuse signal HS1 in response to the control signal S1 output from the control part 1 and outputs the held signal level as the output signal SS1. The holding circuit 13 includes a holding control part 3a, a holding part 3b and the buffer part 3c. The buffer part 3c is connected to the fuse circuit 2 and the holding control part 3a. Upon receiving the fuse signal HS1 output from the fuse circuit 2, the buffer part 3c generates and outputs a fuse transmission signal HDS1 by inverting the signal level of the fuse signal HS1. The holding control part 3a performs transmission control to transmit the fuse transmission signal HDS1, which is based on the fuse signal HS1 output from the fuse circuit 2, to the holding part 3b in response to the control signal S1. The holding part 3b holds the fuse transmission signal HDS1 based on the fuse signal HS1 transmitted from the holding control part 3a and outputs the held fuse transmission signal HDS1 as the output signal SS1.

The buffer part 3c includes a transistor P13 and a transistor N13. The transistor P13 is a PMOS transistor and has a source terminal S connected to the power supply VDD and a gate terminal G connected to the node Nd1 of the fuse circuit 2. The transistor N13 is an NMOS transistor and has a drain terminal D connected to a drain terminal D of the transistor P13, a gate terminal G connected to the node Nd1 of the fuse circuit 2, and a source terminal S connected to the power supply VSS. Here, a node at the connection point between the drain terminal D of the transistor P13 and the drain terminal D of the transistor N13 is called a node Nd2. A signal level of the fuse transmission signal HDS1 is an electric potential of the node Nd2.

Upon receiving the fuse signal HS1, the buffer part 3c generates and outputs the fuse transmission signal HDS1 by inverting the signal level of the fuse signal HS1. For example, when the fuse signal HS1 of a high level is input to the buffer part 3c, the transistor P13 is turned off and the transistor N13 is turned on. Accordingly, the node Nd2 has a low level at about 0 V. As a result, the fuse transmission signal HDS1, which is the output of the buffer part 3c, has a low level. On the other hands, when the fuse signal HS1 of a low level is input to the buffer part 3c, the transistor P13 is turned on and the transistor N13 is turned off. Accordingly, the node Nd2 has a high level at about 5 V. As a result, the fuse transmission signal HDS1, which is the output of the buffer part 3c, has a high level.

Here, since the holding circuit 13 has the buffer part 3c, it is possible to prevent direct connection between the node Nd1 at which the signal level of the fuse signal HS1 is determined and the inverter INV3 of the holding part 3b. Therefore, in the fuse circuit 2, since the fuse signal HS1 can be determined without being affected by the output of the inverter INV3 of the holding part 3b, the fuse signal HS1 can be more quickly set to a desired signal level.

The inverter INV2 of the holding part 3b receives the fuse signal HDS1, which is output from the buffer part 3c, at the input terminal of the inverter INV2 via the holding control part 3a, generates the output signal SS1 by inverting the signal level of the fuse signal HS1 input to the input terminal, and outputs the generated output signal SS1 to an output terminal T1.

Figure 6:
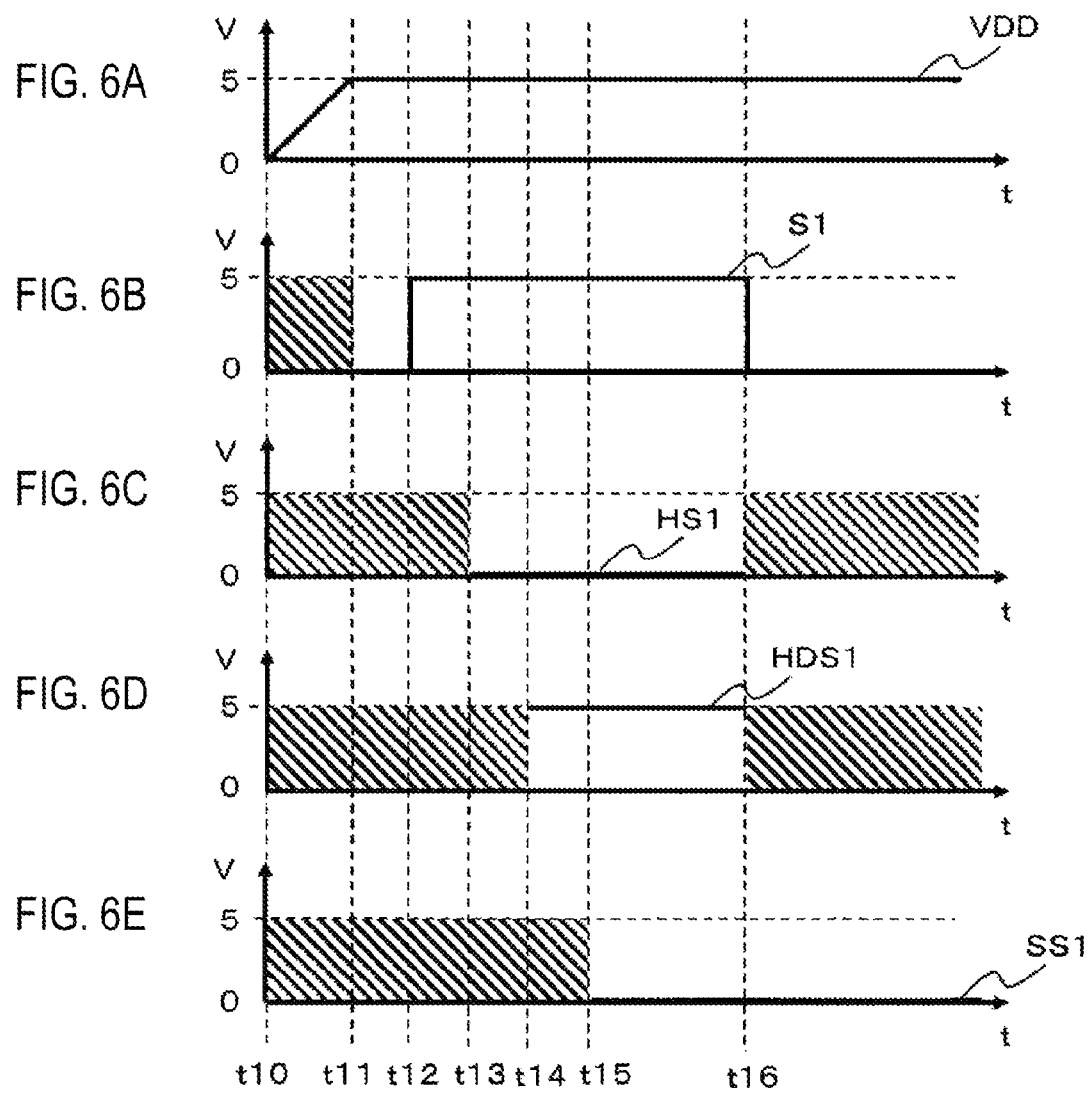
FIGS. 6A to 6E illustrate signal waveforms in the memory circuit 10b as time passes, in a case where the fuse element H1 is disconnected under the output determination mode.

FIGS. 6A to 6E illustrate signal waveforms in the memory circuit 10b as time passes, in a case where the fuse element H1 is disconnected under an output determination mode of determining a signal level of the output signal SS1 of the memory circuit 10b illustrated in FIG. 5. FIG. 6A illustrates transition of a voltage level of the power supply VDD. FIG. 6B is a signal waveform of the control signal S1. FIG. 6C is a signal waveform of the fuse signal HS1. FIG. 6D is a signal waveform of the fuse transmission signal HDS1. FIG. 6E is a signal waveform of the output signal S11. In each of FIGS. 6A to 6E, a vertical axis represents a signal level V and a horizontal axis represents time t. Times t10 to t16 are indicated as common time in FIGS. 6A to 6E. Shaded portions indicate periods in which it is uncertain whether an electric potential has a low level or a high level. In FIGS. 6A to 6E, the same signal waveforms as FIG. 3 according to the first embodiment are denoted by the same reference numerals and explanation of which will not be repeated as appropriate.

At time t10, the power supply VDD is driven. At this point of time, since the power supply VDD is at 0 V, the fuse signal HS1, the fuse transmission signal HDS1 output from the buffer part 3c, and the output signal SS1 determined based on the signal level of the fuse transmission signal HDS1 are all uncertain.

At time t11, the control signal S1 of a low level is output from the control part 1. Accordingly, the transistor N1, the transistor N2 and the transistor P2 are turned off.

At time t12, the control signal S1 of a high level is output from the control part 1, and the transistor N1 is turned on to drive the fuse circuit 2. The transistor N2 and the transistor P2 are also turned on.

Here, since the fuse circuit 2 has the resistance of about 1 MΩ as the fuse element H1 is disconnected, when the transistor N1 having the on-resistance of 10 kΩ is turned on, the electric potential of the node Nd1 gradually approaches to the electric potential of the power supply VSS.

At time t13, the electric potential of the node Nd1 becomes about 0 V, and the fuse signal HS1 of a low level is output from the fuse circuit 2 and is input to the buffer part 3c. In the buffer part 3c, when the fuse signal HS1 of the low level is input thereto, the transistor P13 is turned on and the transistor N13 is turned off. Therefore, the electric potential of the node Nd2 rises as the voltage of the power supply VDD is supplied to the node Nd2 via the transistor P13.

At time t14, the electric potential of the node Nd2 becomes about 5 V and the fuse transmission signal HDS1 of a high level is output from the buffer part 3c. Here, since the transistor N2 and the transistor P2 of the holding control part 3a are both turned on, the fuse transmission signal HDS1 output from the buffer part 3c is transmitted to the inverter INV2.

At time t15, the fuse transmission signal HDS1 of the high level input to the inverter INV2 is inverted and the output signal SS1 of a low level is output from the inverter INV2. Thus, the electric potential of the output terminal T1 has a low level. Here, since the output signal SS1 is also input to the inverter INV3, the output inverted signal SIS1 of a high level is output from the inverter INV3. The output inverted signal SIS1 is input to the input terminal of the inverter INV2.

At time t16, the control signal S1 is switched from the high level to the low level. Thus, the transistor N1 is turned off to stop the driving of the fuse circuit 2 and accordingly the output of the fuse signal HS1 is stopped. At the same time when the output of the fuse signal HS1 is stopped, the transistors N2 and P2 of the holding control part 3a are turned off to stop the supply of the fuse transmission signal HDS1 from the buffer part 3c to the holding part 3b, and accordingly the holding circuit 13 stops updating the fuse transmission signal HDS1, in other words, a signal based on the fuse signal HS1, held in the holding circuit 13. At this time, since the holding part 3b maintains, using the inverter INV2 and the inverter INV3, the signal level based on the fuse signal HS1 input to the holding part 3b while the fuse circuit 2 is driven, the holding part 3b continues to maintain the output signal SS1 of the low level. Thus, the output signal SS1 is determined and the output determination mode is terminated.

Figure 7:
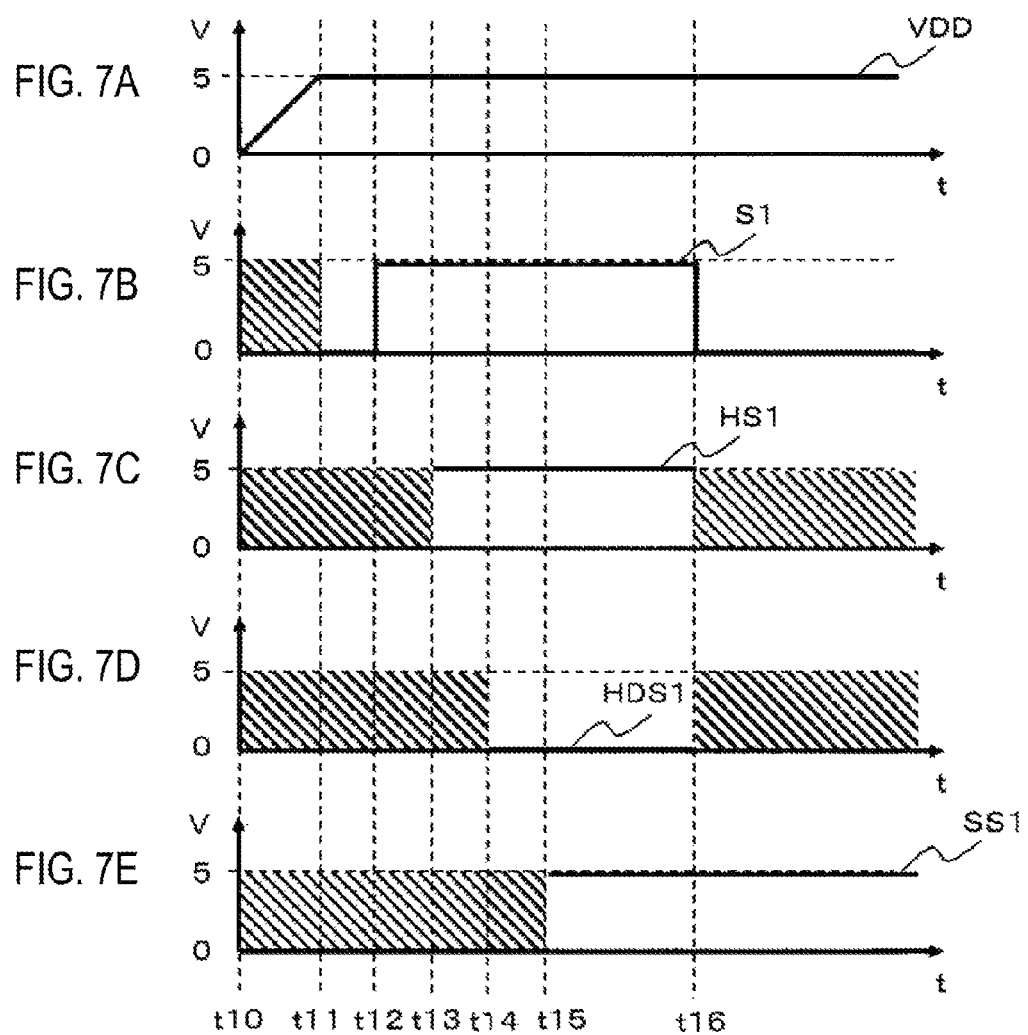
FIGS. 7A to 7E illustrate signal waveforms in the memory circuit 10b as time passes, in a case where the fuse element H1 is not disconnected under the output determination mode.

FIGS. 7A to 7E illustrate signal waveforms in the memory circuit 10b as time passes, in a case where the fuse element H1 is not disconnected under the output determination mode of determining a signal level of the output signal SS1 of the memory circuit 10b illustrated in FIG. 5. FIG. 7A illustrates transition of a voltage level of the power supply VDD. FIG. 7B illustrates a signal waveform of the control signal S1. FIG. 6C illustrates a signal waveform of the fuse signal HS1. FIG. 7D illustrates a signal waveform of the fuse transmission signal HDS1. FIG. 7E illustrates a signal waveform of the output signal S11. In each of FIGS. 7A to 7E, a vertical axis represents a signal level V and a horizontal axis represents time t. Times t10 to t16 are indicated as common time in FIGS. 7A to 7E. Shaded portions indicate periods in which it is uncertain whether a potential has a low level or a high level. In FIGS. 7A to 7E, the same signal waveforms as FIG. 4 according to the first embodiment are denoted by the same reference numerals and explanation of which will not be repeated as appropriate.

At time t10, the power supply VDD is driven. At this point of time, since the power supply VDD is at 0 V, the fuse signal HS1, the fuse transmission signal HDS1 output from the buffer part 3c, and the output signal SS1 determined based on the signal level of the fuse transmission signal HDS1 are all uncertain.

At time t11, the control signal S1 of a low level is output from the control part 1. Accordingly, the transistor N1, the transistor N2 and the transistor P2 are turned off.

At time t12, the control signal S1 of a high level is output from the control part 1, and the transistor N1 is turned on to drive the fuse circuit 2. The transistor N2 and the transistor P2 are also turned on.

Here, since the fuse circuit 2 has the resistance of 100Ω as the fuse element H1 is not disconnected, when the transistor N1 having the on-resistance of 10 kΩ is turned on, the electric potential of the node Nd1 begins to rise from the point of time t12.

At time t13, the electric potential of the node Nd1 becomes about 0 V, and the fuse signal HS1 of a high level is output from the fuse circuit 2 and is input to the buffer part 3c. In the buffer part 3c, when the fuse signal HS1 of the high level is input thereto, the transistor P13 is turned off and the transistor N13 is turned on. Therefore, the electric potential of the node Nd2 gradually approaches to the electric potential of the power supply VSS as the voltage of the power supply VSS is supplied to the node Nd2 via the transistor N13.

At time t14, the electric potential of the node Nd2 becomes about 0 V and the fuse transmission signal HDS1 of a low level is output from the buffer part 3c. Here, since the transistors N2 and P2 of the holding control part 3a are both turned on, the fuse transmission signal HDS1 output from the buffer part 3c is transmitted to the inverter INV2.

At time t15, the fuse transmission signal HDS1 of the low level input to the inverter INV2 is inverted and the output signal SS1 of a high level is output from the inverter INV2. Thus, the electric potential of the output terminal T1 has a high level. Here, since the output signal SS1 is also input to the inverter INV3, the output inverted signal SIS1 of a high level is output from the inverter INV3. The output inverted signal SIS1 is input to the input terminal of the inverter INV2.

At time t16, the control signal S1 is switched from the high level to the low level. Thus, the transistor N1 is turned off to stop the driving of the fuse circuit 2 and accordingly the output of the fuse signal HS1 is stopped. At the same time when the output of the fuse signal HS1 is stopped, the transistors N2 and P2 of the holding control part 3a are turned off to stop the supply of the fuse transmission signal HDS1 from the buffer part 3c to the holding part 3b, and accordingly the holding circuit 13 stops updating the fuse transmission signal HDS1, in other words, a signal based on the fuse signal HS1, held in the holding circuit 13. At this time, since the holding part 3b maintains, using the inverter INV2 and the inverter INV3, the signal level based on the fuse signal HS1 input to the holding part 3b while the fuse circuit 2 is driven, the holding part 3b continues to maintain the output signal SS1 of the high level. Thus, the output signal SS1 is determined and the output determination mode is terminated.

As described above, the memory circuit 10b according to the second embodiment includes the buffer part 3c. Therefore, since the fuse signal HS1 can be determined without being affected by the output of the inverter INV3 of the holding part 3b, the fuse signal HS1 can be more quickly set to a desired signal level, in addition to the effects obtained in the memory circuit 10a according to the first embodiment. As a result, it is possible to suppress an increase in time required for the output determination mode and further quickly use a product equipped with the memory circuit 10b after being powered on.

Third Embodiment

Figure 8:
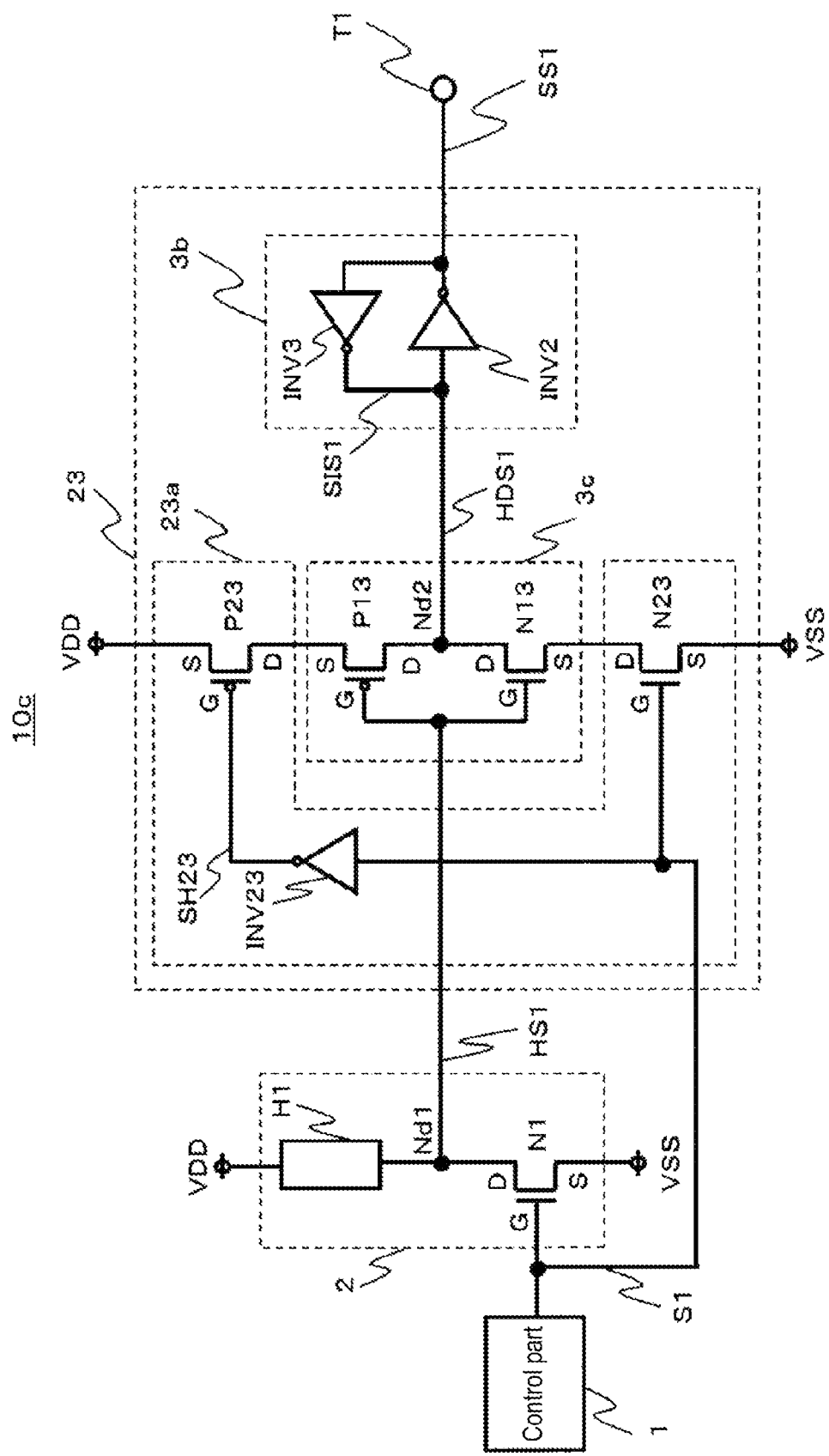
FIG. 8 is a circuit diagram of a memory circuit 10c according to a third embodiment of the present disclosure.

FIG. 8 is a circuit diagram illustrating a memory circuit 10c according to a third embodiment of the present disclosure. The memory circuit 10c includes a control part 1, a fuse circuit 2 and a holding circuit 23. The memory circuit 10c of the third embodiment is different from the memory circuit 10a of the first embodiment in that the holding circuit 23 is replaced for the holding circuit 3 and particularly, in that the holding circuit 23 includes a holding control part 23a replaced for the holding control part 3a of the holding circuit 3 and further includes a buffer part 3c. In addition, the memory circuit 10c of the third embodiment is different from the memory circuit 10b of the second embodiment in that the holding circuit 23 is replaced for the holding circuit 13 and in that the holding circuit 23 includes the holding control part 23a replaced for the holding control part 3a of the holding circuit 13. In the memory circuit 10c illustrated in FIG. 8, the same elements as those in the memory circuits 10, 10a and 10b shown in FIGS. 1, 2 and 5 are denoted by the same reference numerals and explanation of which will not be repeated as appropriate. The write control part 4 and the write verification part 5 are omitted for the convenience of drawing.

The holding circuit 23 holds a signal level based on the fuse signal HS1 in response to the control signal S1 output from the control part 1 and outputs the held signal level as the output signal SS1. The holding circuit 23 includes the holding control part 23a, the holding part 3b and the buffer part 3c. The holding control part 23a performs transmission control to transmit the fuse signal HS1, which is output from the fuse circuit 2, to the holding part 3b in response to the control signal S1. The holding part 3b holds a signal based on the fuse signal HS1 transmitted by the holding control part 23a and outputs the held signal as the output signal SS1.

The holding control part 23a includes an inverter INV23, a transistor P23 as a first control switch, and a transistor N23 as the first control switch. The inverter INV23 has an input terminal connected to the control part 1, and an output terminal through which a control inverted signal SH23 generated by inverting a signal level of the control signal S1 input from the control part 1 is output. The transistor P23, which is a PMOS transistor, has a source terminal S connected to the power supply VDD, a gate terminal G as a control terminal connected to an output terminal of the inverter INV23, and a drain terminal D connected to a source terminal S of a transistor P13 of the buffer part 3c. The transistor P23 is turned on and off based on the control inverted signal SH23 supplied from the inverter INV23, in other words, based on the control signal S1. The transistor N23, which is an NMOS transistor, has a drain terminal D connected to a source terminal S of a transistor N13 of the buffer part 3c, a gate terminal G as a control terminal connected to the control part 1, and a source terminal S connected to the power supply VSS. The transistor N23 is turned on and off based on the control signal S1 supplied from the control part 1.

The buffer part 3c is controlled to be driven by turning-on and turning-off of the transistors P23 and N23 of the holding control part 23a. Specifically, when the transistor P23 and the transistor N23 are turned on, the buffer part 3c is driven by a current supplied from the power supply VDD and outputs the fuse transmission signal HDS1 having signal level obtained by the signal level of the fuse signal HS1. In the third embodiment, as described above, the holding circuit 23 is provided so that the transmission control to transmit the fuse transmission signal HDS1 based on the fuse signal HS1 to the holding unit 3b, i.e., the driving of the buffer part 3c, is controlled by the holding control part 23a. Accordingly, it is unnecessary to interpose the transistor N2 and the transistor P2, as the holding control part 3a, between the fuse transmission signal HDS1 and the holding part 3b, unlike the holding circuit 13 of the second embodiment. Therefore, it is possible to more quickly transmit the fuse transmission signal HDS1 from the buffer part 3c to the holding part 3b.

Figure 9:
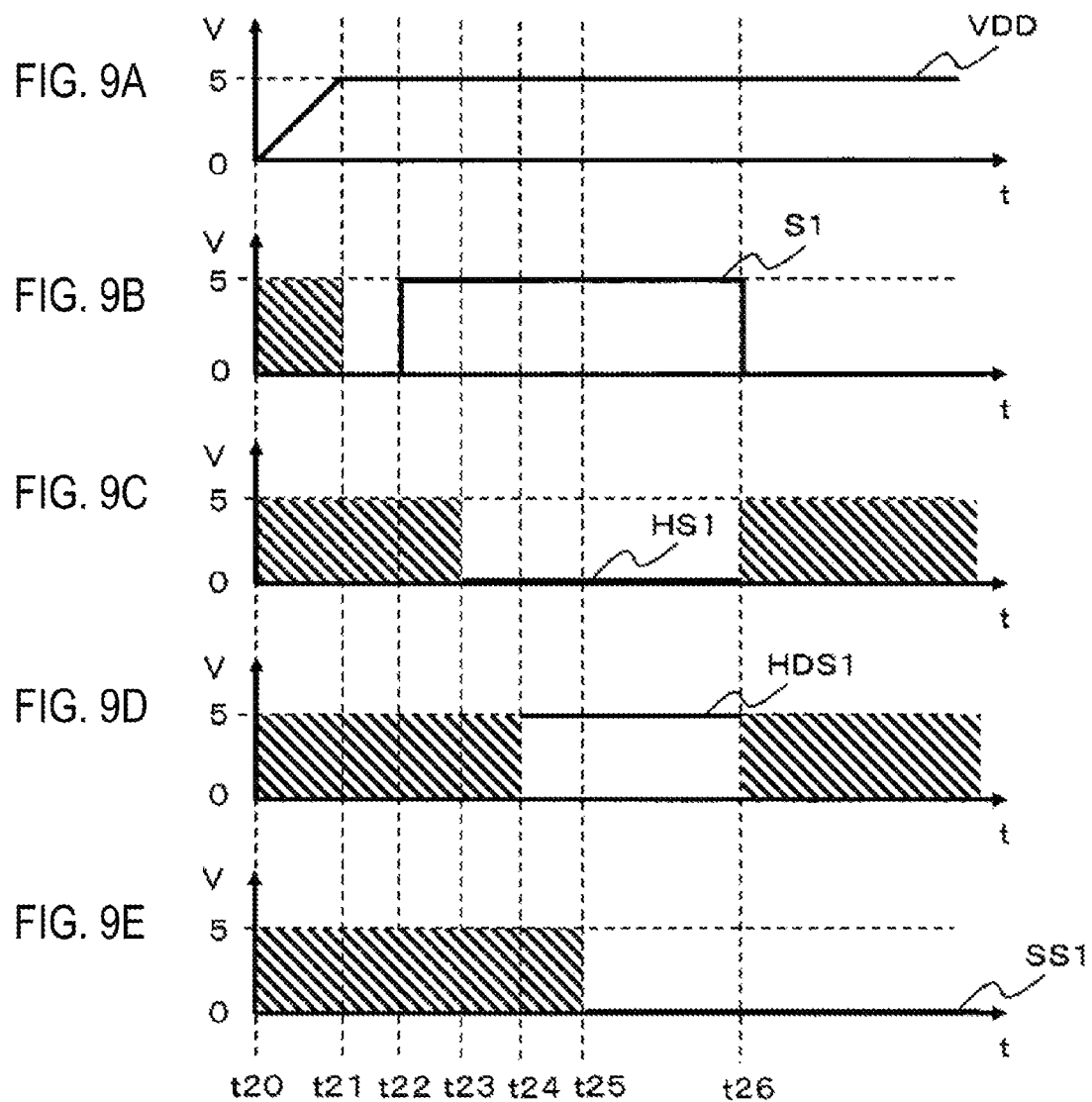
FIGS. 9A to 9E illustrate signal waveforms in the memory circuit 10c as time passes, in a case where the fuse element H1 is disconnected under the output determination mode.

FIGS. 9A to 9E illustrate signal waveforms in the memory circuit 10c as time passes, in a case where the fuse element H1 is disconnected under an output determination mode of determining a signal level of the output signal SS1 of the memory circuit 10c illustrated in FIG. 8. FIG. 9A illustrates transition of a voltage level of the power supply VDD. FIG. 9B is a signal waveform of the control signal S1. FIG. 9C is a signal waveform of the fuse signal HS1. FIG. 9D is a signal waveform of the fuse transmission signal HDS1. FIG. 9E is a signal waveform of the output signal S11. In each of FIGS. 6A to 6E, a vertical axis represents a signal level V and a horizontal axis represents time t. Times t20 to t26 are indicated as common time in FIGS. 9A to 9E. Shaded portions indicate periods in which it is uncertain whether a potential has a low level or a high level. In FIGS. 9A to 9E, the same signal waveforms as FIG. 3 according to the first embodiment are denoted by the same reference numerals and explanation of which will not be repeated as appropriate.

At time t20, the power supply VDD is driven. At this point of time, since the power supply VDD is at 0 V, the fuse signal HS1, the fuse transmission signal HDS1 output from the buffer part 3c, and the output signal SS1 determined based on the signal level of the fuse transmission signal HDS1 are all uncertain.

At time t21, the voltage level of the power supply VDD rises and is stabilized at 5 V, and the control signal S1 of a low level at about 0 V is output from the control part 1. The control signal S1 of the low level is supplied to the gate terminal G of the transistor N1 of the fuse circuit 2 and the gate terminal G of the transistor N23, thereby turning off the transistor N1 and the transistor N23. In addition, the control signal S1 of the low level is supplied to the input terminal of the inverter INV23. Accordingly, the control inverted signal SH23 of a high level at about 5 V is output from the inverter INV23 and is supplied to the gate terminal G of the transistor P23, thereby turning off the transistor P23.

At time t22, that is, after the power supply VDD is stabilized at a predetermined electric potential, the control signal S1 of a high level at about 5 V is output from the control part 1. The transistor N1 is turned on upon receiving the control signal S1 of the high level at its gate terminal G, thereby driving the fuse circuit 2. In addition, the transistor N23 is turned on upon receiving the control signal S1 of the high level at its gate terminal G, and the transistor P23 is turned on upon receiving the control inverted signal SH23 of a low level at its gate terminal G from the inverter INV23 supplied with the control signal S1 of the high level. Thus, a voltage is supplied from the power supply VDD to the buffer part 3c and the buffer part 3c is driven.

Here, since the fuse circuit 2 has the resistance of about 1 MΩ as the fuse element H1 is disconnected, when the transistor N1 having the on-resistance of 10 kΩ is turned on, the electric potential of the node Nd1 gradually approaches to the electric potential of the power supply VSS.

At time t23, the electric potential of the node Nd1 becomes about 0 V and the fuse signal HS1 of a low level is output from the fuse circuit 2. In the buffer part 3c, when the fuse signal HS1 of the low level is input thereto, the transistor P13 is turned on and the transistor N13 is turned off. Therefore, the electric potential of the node Nd2 rises as the voltage of the power supply VDD is supplied to the node Nd2 via the transistor P23.

At time t24, the electric potential of the node Nd2 becomes 5 V and the fuse transmission signal HDS1 of a high level is output from the buffer part 3c and is input to the inverter INV2.

At time t25, the fuse transmission signal HDS1 input to the inverter INV2 is inverted and the output signal SS1 of a low level is output from the inverter INV2. Thus, the electric potential of the output terminal T1 has a low level. Here, since the output signal SS1 is also input to the inverter INV3, the output inverted signal SIS1 of a high level is output from the inverter INV3. The output inverted signal SIS1 is input to the input terminal of the inverter INV2.

At time t26, the control signal S1 is switched from the high level to the low level. Thus, the transistor N1 is turned off to stop the driving of the fuse circuit 2 and accordingly the output of the fuse signal HS1 is stopped. At the same time when the output of the fuse signal HS1 is stopped, the transistors P23 and N23 of the holding control part 23a are turned off to stop the driving of the buffer part 3c, thereby stopping the output of the fuse transmission signal HDS1, and accordingly the holding circuit 23 stops updating the fuse transmission signal HDS1, in other words, a signal based on the fuse signal HS1, held in the holding circuit 23. At this time, since the holding part 3b maintains, using the inverter INV2 and the inverter INV3, the signal level based on the fuse signal HS1 input to the holding part 3b while the fuse circuit 2 is driven, the holding part 3b continues to maintain the output signal SS1 of the low level. Thus, the output signal SS1 is determined and the output determination mode is terminated.

Figure 10:
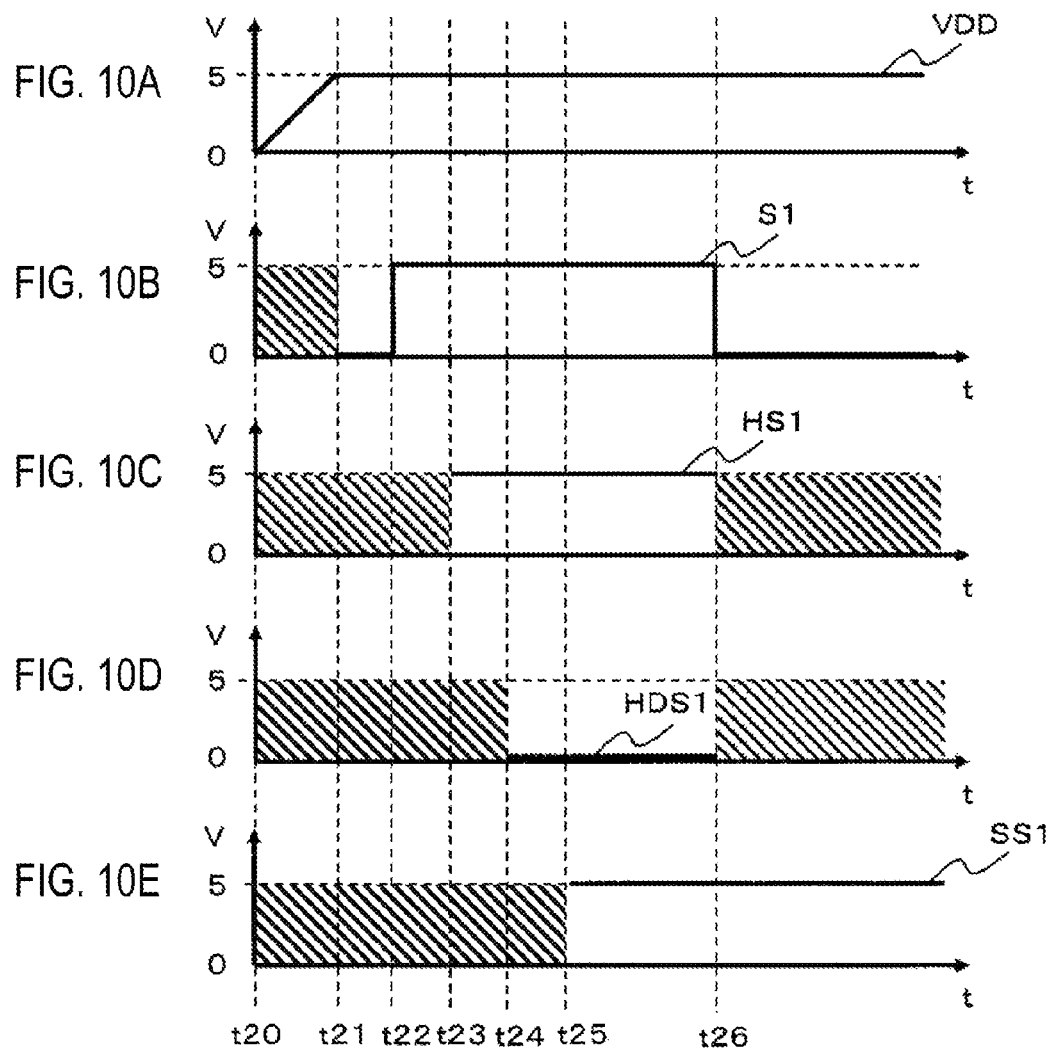
FIGS. 10A to 10E illustrate signal waveforms in the memory circuit 10c as time passes, in a case where the fuse element H1 is not disconnected under an output determination mode.

FIGS. 10A to 10E illustrate signal waveforms in the memory circuit 10c as time passes, in a case where the fuse element H1 is not disconnected under the output determination mode of determining a signal level of the output signal SS1 of the memory circuit 10c illustrated in FIG. 8. FIG. 10A illustrates transition of a voltage level of the power supply VDD. FIG. 10B is a signal waveform of the control signal S1. FIG. 10C is a signal waveform of the fuse signal HS1. FIG. 10D is a signal waveform of the fuse transmission signal HDS1. FIG. 10E is a signal waveform of the output signal S11. In each of FIGS. 10A to 10E, a vertical axis represents a signal level V and a horizontal axis represents time t. Times t20 to t26 are indicated as common time in FIGS. 10A to 10E. Shaded portions indicate periods in which it is uncertain whether a potential has a low level or a high level. In FIGS. 10A to 10E, the same signal waveforms as FIG. 4 according to the first embodiment are denoted by the same reference numerals and explanation of which will not be repeated as appropriate.

At time t20, the power supply VDD is driven. At this point of time, since the power supply VDD is at 0 V, the fuse signal HS1, the fuse transmission signal HDS1 output from the buffer part 3c, and the output signal SS1 determined based on the signal level of the fuse transmission signal HDS1 are all uncertain.

At time t21, the voltage level of the power supply VDD rises and is stabilized at 5 V, and the control signal S1 of a low level at about 0 V is output from the control part 1. The control signal S1 of the low level is supplied to the gate terminal G of the transistor N1 of the fuse circuit 2 and the gate terminal G of the transistor N23, thereby turning off the transistor N1 and the transistor N23. In addition, the control signal S1 of the low level is supplied to the input terminal of the inverter INV23. Accordingly, the control inverted signal SH23 of a high level at about 5 V is output from the inverter INV23 and is supplied to the gate terminal G of the transistor P23, thereby turning off the transistor P23.

At time t22, that is, after the power supply VDD is stabilized at a predetermined electric potential, the control signal S1 of a high level at about 5 V is output from the control part 1. The transistor N1 is turned on upon receiving the control signal S1 of the high level at its gate terminal G, thereby driving the fuse circuit 2. In addition, the transistor N23 is turned on upon receiving the control signal S1 of the high level at its gate terminal G, and the transistor P23 is turned on upon receiving the control inverted signal SH23 of a low level at its gate terminal G from the inverter INV23 supplied with the control signal S1 of the high level. Thus, a voltage is supplied from the power supply VDD to the buffer part 3c and the buffer part 3c is driven.

Here, since the fuse circuit 2 has the resistance of about 100Ω as the fuse element H1 is not disconnected, when the transistor N1 having the on-resistance of 10 kΩ is turned on, the electric potential of the node Nd1 begins to rise from the point of time t22.

At time t23, the electric potential of the node Nd1 becomes about 5 V and the fuse signal HS1 of a high level is output from the fuse circuit 2. In the buffer part 3c, when the fuse signal HS1 of the high level is input thereto, the transistor P13 is turned on and the transistor N13 is turned off. Therefore, the electric potential of the node Nd2 rises as the voltage of the power supply VDD is supplied to the node Nd2 via the transistor P23.

At time t24, the electric potential of the node Nd2 becomes 5 V and the fuse transmission signal HDS1 of a high level is output from the buffer part 3c and is input to the inverter INV2.

At time t25, the fuse transmission signal HDS1 input to the inverter INV2 is inverted and the output signal SS1 of a low level is output from the inverter INV2. Thus, the electric potential of the output terminal T1 has a low level. Here, since the output signal SS1 is also input to the inverter INV3, the output inverted signal SIS1 of a high level is output from the inverter INV3. The output inverted signal SIS1 is input to the input terminal of the inverter INV2.

At time t26, the control signal S1 is switched from the high level to the low level. Thus, the transistor N1 is turned off to stop the driving of the fuse circuit 2 and accordingly the output of the fuse signal HS1 is stopped. At the same time when the output of the fuse signal HS1 is stopped, the transistor P23 and the transistor N23 of the holding control part 23a are turned off to stop the driving of the buffer part 3c, thereby stopping the output of the fuse transmission signal HDS1, and accordingly the holding circuit 23 stops updating the fuse transmission signal HDS1, in other words, a signal based on the fuse signal HS1, held in the holding circuit 23. At this time, since the holding part 3b maintains, using the inverter INV2 and the inverter INV3, the signal level based on the fuse signal HS1 input to the holding part 3b while the fuse circuit 2 is driven, the holding part 3b continues to maintain the output signal SS1 of the high level. Thus, the output signal SS1 is determined and the output determination mode is terminated.

As described above, according to the memory circuit 10c of the third embodiment, the holding circuit 23 is provided so that the transmission control to transmit the fuse transmission signal HDS1 based on the fuse signal HS1 to the holding part 3b is performed by controlling the driving of the buffer part 3c by means of the holding control part 23a. Accordingly, it is possible to more quickly transmit the fuse transmission signal HDS1 from the buffer part 3c to the holding part 3b than the memory circuit 10b of the second embodiment. As a result, it is possible to suppress an increase in time required for the output determination mode and further quickly use a product equipped with the memory circuit 10c after being powered on.

Fourth Embodiment

Figure 11:
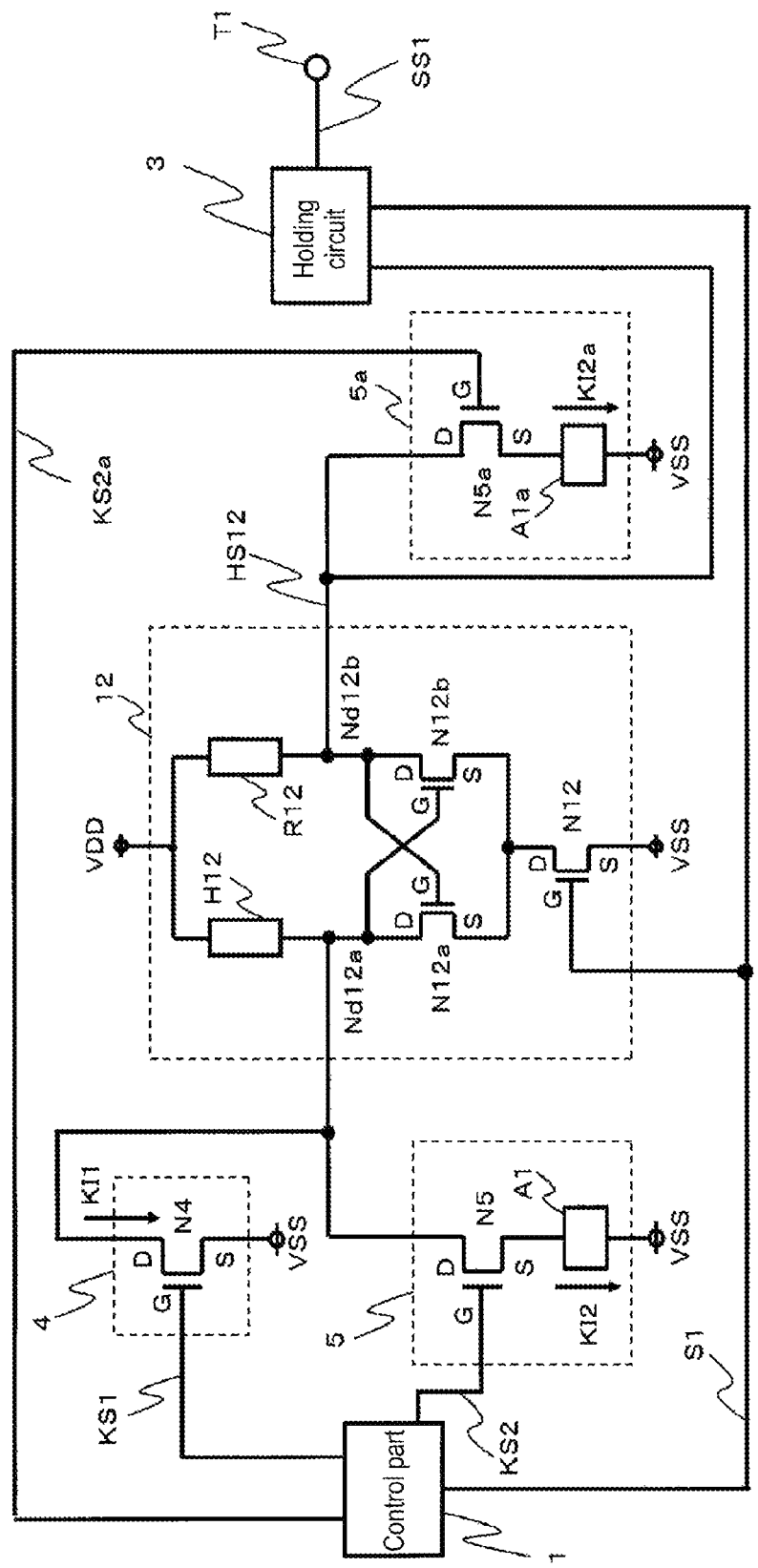
FIG. 11 is a circuit diagram of a memory circuit 10d according to a fourth embodiment of the present disclosure.

FIG. 11 is a circuit diagram of a memory circuit 10d according to a fourth embodiment of the present disclosure. The memory circuit 10d includes a control part 1, a fuse circuit 12, a holding circuit 3, a write control part 4, a write verification part 5, and a write verification part 5a. The memory circuit 10d of the fourth embodiment is different from the memory circuits 10a to 10c of the first to third embodiments in that the fuse circuit 12 is replaced for the fuse circuit 2 and in that the memory circuit 10d further includes the write verification part 5a. In the memory circuit 10d illustrated in FIG. 11, the same elements as those in the memory circuits 10 and 10a to 10c illustrated in FIGS. 1, 2, 5 and 8 are denoted by the same reference numerals and explanation of which will not be repeated as appropriate. Although it is illustrated in FIG. 11 that the holding circuit 3 is applied to the memory circuit 10d, without being limited thereto, the holding circuit 13 or the holding circuit 23 may be replaced for the holding circuit 3.

The fuse circuit 12 includes a fuse element H12 as a first fuse element, a resistor R12 as a first resistor, a transistor N12a as a third NMOS transistor, a transistor N12b as a fourth NMOS transistor, and a transistor N12 as a second switching element.

The fuse element H12 has one end connected to the power supply VDD. For example, when the fuse element H12 is not disconnected, the resistance across the fuse element H12 is 100Ω. On the other hand, when the fuse element H12 is disconnected, the resistance across the fuse element H12 is about 1 MΩ. The fuse element H12 is made of material generally used for a fuse element, for example, polysilicon or aluminum (Al).

The resistor R12 has one end connected to the power supply VDD and the one end of the fuse element H12, and is connected in parallel to the fuse element H12 with respect to the power supply VDD. The resistance of the resistor R12 is, for example, 10 kΩ. The resistor R12 is configured by material generally used for a fuse element, for example, polysilicon or aluminum, a resistive element, an impurity resistor, or a PMOS transistor having a gate terminal grounded at all times and set to be turned on at all times.

The transistor N12a has a drain terminal D connected to the other end of the fuse element H12 and a gate terminal G connected to the other end of the resistor R12. The transistor N12b has a drain terminal D connected to the other end of the resistor R12, a gate terminal G connected to the other end of the fuse element H12, and a source terminal S connected to a source terminal S of the transistor N12a. Here, a node at the connection point between the other end of the resistor R12 and the drain terminal D of the transistor N12b is referred to as a node Nd12b as a third node and a node at the connection point between the other end of the fuse element H12 and the drain terminal D of the transistor N12a is referred to as a node Nd12a as a fourth node.

The transistor N12 is an NMOS transistor and has a drain terminal D as one end connected in common to the source terminal S of the transistor N12a and the source terminal S of the transistor N12b, a gate terminal G as a control terminal connected to the control part 1, and a source terminal S as the other end connected to the power supply VSS. The transistor N12 is turned on and off based on the control signal S1 supplied from the control part 1 to the gate terminal G, thereby controlling driving of the fuse circuit 12, i.e., circuit operation of the fuse circuit 12.

The fuse circuit 12 is driven when the control signal S1 output from the control part 1 is applied to the gate terminal G of the transistor N12, and outputs a fuse signal HS12 whose signal level is determined based on a state of the fuse element H12 included in the fuse circuit 12. Here, the signal level of the fuse signal HS12 is the electric potential of the node Nd12b at the connection point between the other end of the resistor R12 and the drain terminal D of the transistor N12b, which is determined based on the magnitude relationship between the resistance of the fuse element H12 and the resistance of the resistor R12.

In the fuse circuit 12, when the fuse element H12 is disconnected, since the resistance across the fuse element H12 is about 1 MΩ and is higher than 10 kΩ which is the resistance of the resistor R12, the node Nd12b outputs the fuse signal HS12 of a high level at about 5 V. When the fuse element H12 is not disconnected, since the resistance across the fuse element H12 is 100Ω, and is lower than 10 kΩ which is the resistance of the resistor R12, the node Nd12b outputs the fuse signal HS12 of a low level at about 0 V.

Here, the resistor R12 is configured such that its resistance is set independently from the electric potential of the node Nd12a. This is because, if the resistance of the resistor R12 depends on the node Nd12a, when the transistor N12a is turned off, and particularly when the fuse element H12 is completely or partially disconnected, the fuse signal HS12 is likely to have a wrong signal level due to an effect of the node Nd12b on the resistance of the resistor R12. In the fuse circuit 12 of the fourth embodiment, the resistor R12 is configured by material generally used for a fuse element, for example, polysilicon or aluminum, a resistive element, an impurity resistor, or a PMOS transistor having a gate terminal grounded at all times and set to be turned on at all times. Thus, the resistance of the resistor R12 has no dependency on the electric potential of the node Nd12a. Accordingly, it is possible to prevent the fuse signal HS12 from having a wrong signal level and further to prevent an output signal SS1 from having a wrong signal level.

The transistor N4 of the write control part 4 has a drain terminal D connected to the node Nd12a. When the transistor N4 is turned on, a write current KI1 is flown from the power supply VDD into the fuse element H12 and the fuse element H12 is disconnected in response to a current value controlled by the transistor N4. In other words, the transistor N4 performs control for disconnecting the fuse element H12 by flowing the write current KI1 into the fuse element H12.

The transistor N5 of the write verification part 5 has a drain terminal D connected to the node Nd12a. When the transistor N5 is turned on, a verification current KI2 is flown from the power supply VDD into a current measuring means A1 via the fuse element H12 and the transistor N5. By measuring a current value of the verification current KI2 at the current measuring means A1, it is possible to verify a disconnect state of the fuse element H12.

The write verification part 5a includes a transistor N5a and a current measuring means A1a. The transistor N5a has a drain terminal D connected to the node Nd12b and a gate terminal G connected to the control part 1. The current measuring means A1a has one end connected to a source terminal S of the transistor N5a and the other end connected to the power supply VSS. The transistor N5a is turned on and off based on a write verification signal KS2a input from the control part 1 to the gate terminal G of the transistor N5a. When the transistor N5a is turned on, a verification current KI2a is flown from the power supply VDD into the current measuring means A1a via the resistor R12 and the transistor N5a. By measuring a current value of the verification current KI2a at the current measuring means A1a, it is possible to verify the actual resistance of the resistor R12. An example of the current measuring means A1 may include an ammeter or the like which is known in the art.

Next, an operation until the signal level of the fuse signal HS12 output from the fuse circuit 12 is determined, in a case where the fuse element H12 is disconnected under an output determination mode of determining the output signal SS1 of the memory circuit 10d illustrated in FIG. 11, will be described.

In the fuse circuit 12, when the voltage of the power supply VDD becomes a rated voltage of, for example, 5 V and the control signal S1 of a high level is supplied from the control part 1 to the gate terminal G of the transistor N12, the transistor N12 is turned on to start driving of the fuse circuit 12. Since the resistance of the fuse element H12 is about 1 MΩ as the fuse element H12 is disconnected, the electric potential of the node Nd12b has a high level at about 5 V as the node Nd12b receives the voltage of the power supply VDD via the resistor R12.

When the node Nd12b has the high level, since a voltage of a high level is applied to the gate terminal G of the transistor N12a, the transistor N12a is turned on. Thus, the electric potential of the node Nd12a has a low level at about 0 V as the node Nd12a receives the voltage of the power supply VSS via the transistor N12a and the transistor N12.

When the electric potential of the node Nd12a has the low level, since a voltage of a low level is applied to the gate terminal G of the transistor N12b, the transistor N12b is turned off. Thus, since the node Nd12b is electrically disconnected from the power supply VSS, the electric potential of the node Nd12b maintains a high level. Therefore, the fuse signal HS12 of a high level is stably output from the fuse circuit 12.

Next, an operation until the signal level of the fuse signal HS12 output from the fuse circuit 12 is determined, in a case where the fuse element H12 is not disconnected under an output determination mode of determining the output signal SS1 of the memory circuit 10d illustrated in FIG. 11, will be described.

In the fuse circuit 12, when the voltage of the power supply VDD becomes a rated voltage of, for example, 5 V and the control signal S1 of a high level is supplied from the control part 1 to the gate terminal G of the transistor N12, the transistor N12 is turned on to start driving of the fuse circuit 12. Since the resistance of the fuse element H12 is about 10 kΩ as the fuse element H12 is not disconnected, the electric potential of the node Nd12a has a high level at about 5 V as the node Nd12a receives the voltage of the power supply VDD via the fuse element H12.

When the node Nd12a has the high level, since a voltage of a high level is applied to the gate terminal G of the transistor N12b, the transistor N12b is turned on. Thus, the electric potential of the node Nd12b has a low level at about 0 V as the node Nd12b receives the voltage of the power supply VSS via the transistor N12b and the transistor N12.

When the electric potential of the node Nd12b has the low level, since a voltage of a low level is applied to the gate terminal G of the transistor N12a, the transistor N12a is turned off. Thus, since the node Nd12a is electrically disconnected from the power supply VSS, the electric potential of the node Nd12a maintains a high level and the transistor N12b is stably turned on. Therefore, the electric potential of the node Nd12b is stabilized at the low level and the fuse signal HS12 of a low level is stably output from the fuse circuit 12.

As described above, according to the memory circuit 10d of the fourth embodiment, in the fuse circuit 12 which includes the fuse element H12, the resistor R12, the transistor N12a and the transistor N12b and determines the signal level of the fuse signal HS12 based on the magnitude relationship between the resistance of the fuse element HS12 and the resistance of the resistor R12, the resistance of the resistor R12 is determined independently from the electric potential of the node Nd12a. Accordingly, it is possible to prevent the determination of the fuse signal HS12 from being delayed and further prevent the determination of the signal level of the output signal SS1 from being delayed. As a result, it is possible to suppress an increase in time required for the output determination mode and further quickly use a product equipped with the memory circuit 10d after being powered on.

Fifth Embodiment

Figure 12:
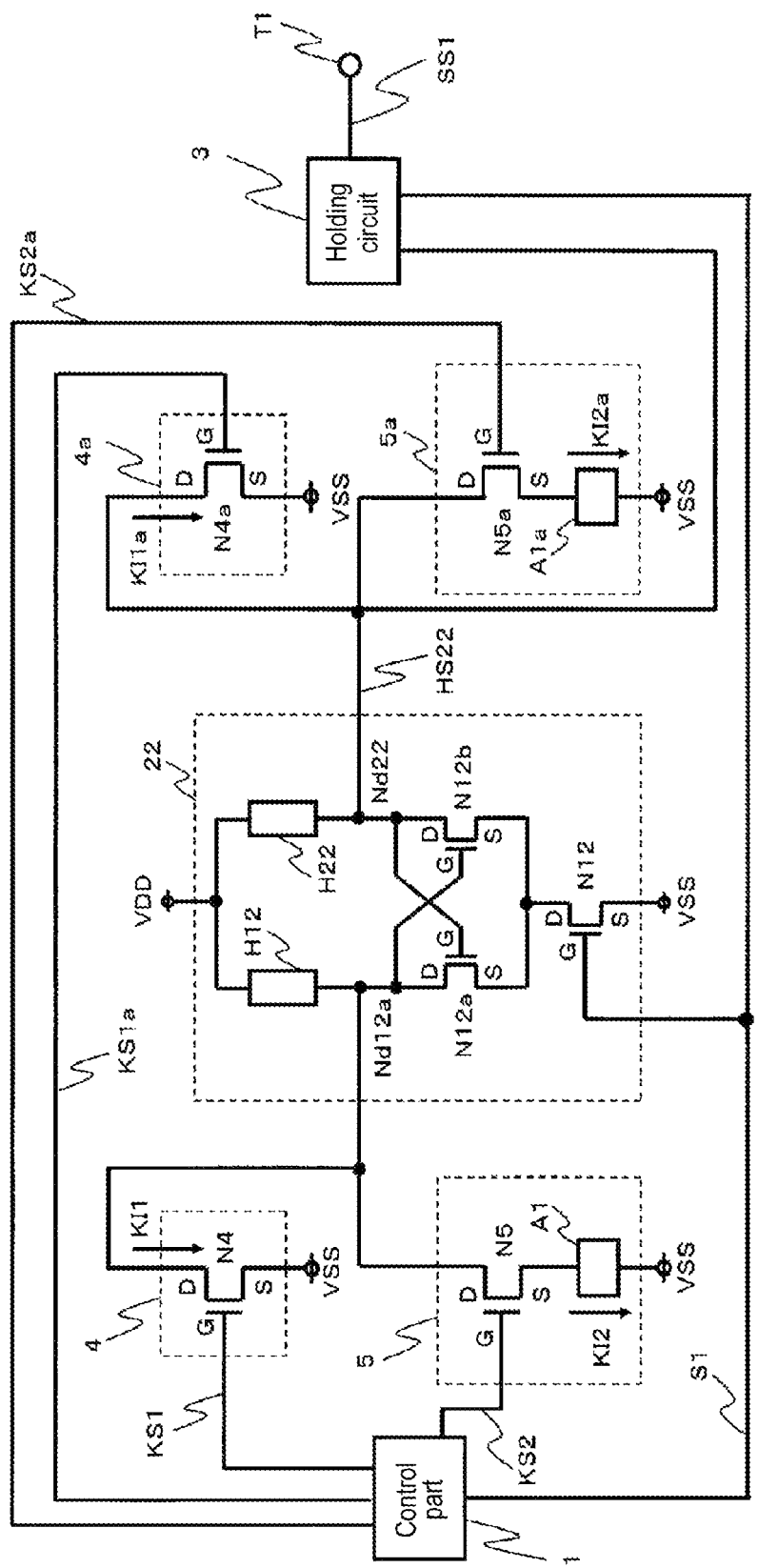
FIG. 12 is a circuit diagram of a memory circuit 10e according to a fifth embodiment of the present disclosure.
Figure 13:
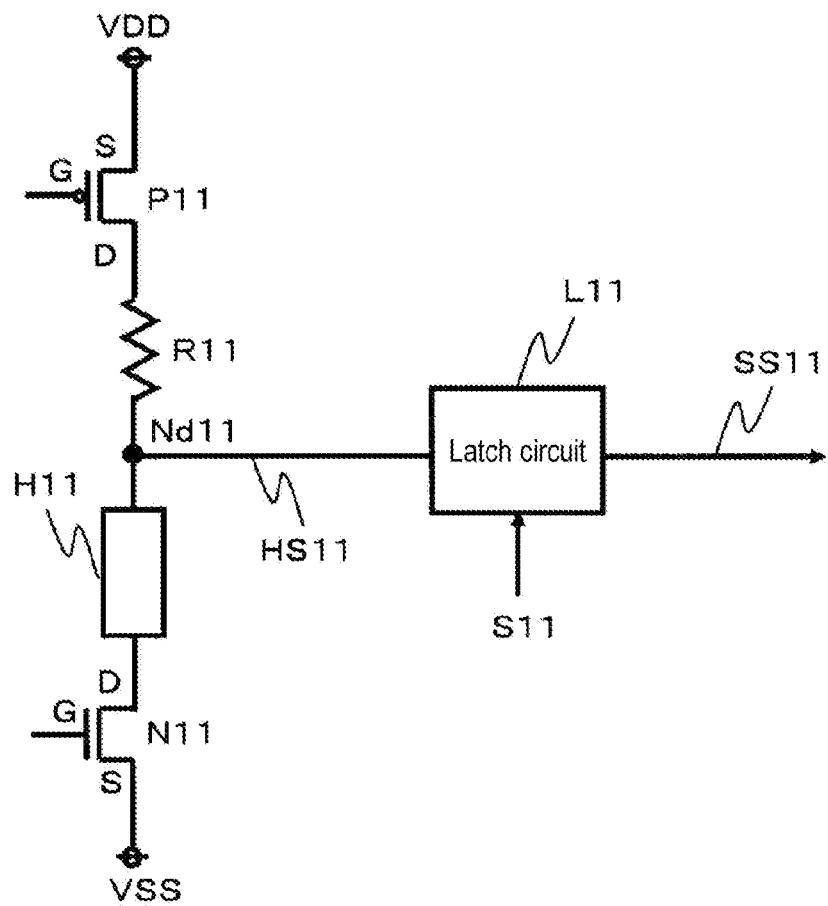
FIG. 13 is a schematic view illustrating a conventional memory circuit 20.
Figure 14A:
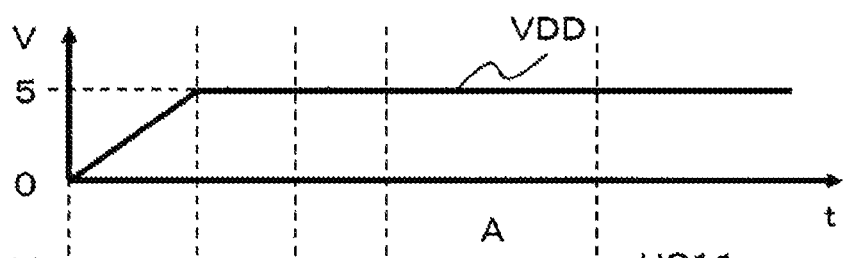
FIGS. 14A to 14D illustrate signal waveforms in the memory circuit 20 as time passes, in a case where a fuse element H11 is disconnected.
Figure 14B:
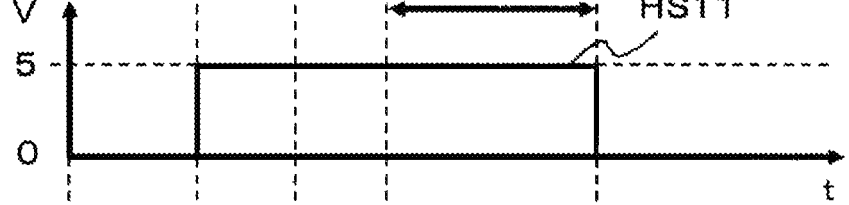
Figure 14C:
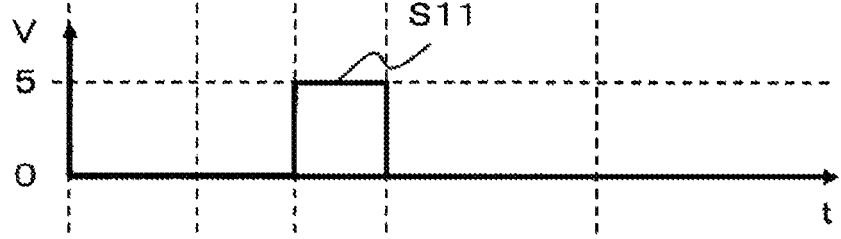
Figure 14D:
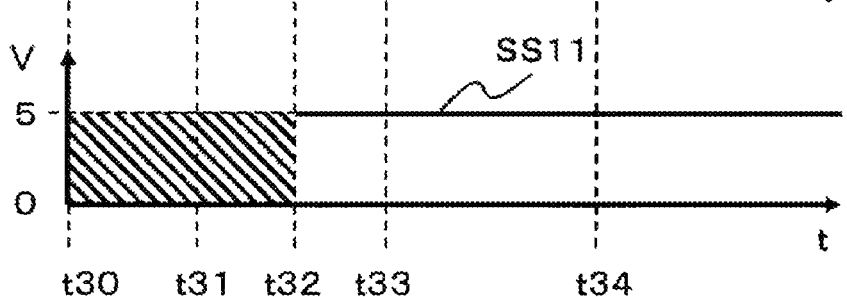

FIG. 12 is a circuit diagram of a memory circuit 10e according to a fifth embodiment of the present disclosure. The memory circuit 10e includes a control part 1, a fuse circuit 22, a holding circuit 3, a write control part 4, a write verification part 5, a write control part 4a and a write verification part 5a. The memory circuit 10e of the fifth embodiment is different from the memory circuit 10d of the fourth embodiment in that the fuse circuit 22 is replaced for the fuse circuit 12 and particularly, in that a fuse element H22 is replaced for the resistor R12 of the fuse circuit 12. In addition, the memory circuit 10e of the fifth embodiment is different from the memory circuit 10d in that the memory circuit 10e includes the write control part 4a. In the memory circuit 10e illustrated in FIG. 12, the same elements as the memory circuits 10 and 10a to 10d illustrated in FIGS. 1, 2, 5, 8 and 11 are denoted by the same reference numerals and explanation of which will not be repeated as appropriate. Although the holding circuit 3 is applied to the memory circuit 10e illustrated in FIG. 12, without being limited thereto, the holding circuit 13 or the holding circuit 23 may be replaced for the holding circuit 3.

The fuse circuit 22 includes a fuse element H12, a fuse element H22 which is a first resistor and serves as a second fuse element, a transistor N12a, a transistor N12b, and a transistor N12.

The fuse element H22 has the same size as the fuse element H12, and has one end connected to the power supply VDD and one end of the fuse element H12. When the fuse element H12 is not disconnected, the resistance across the fuse element H22 is 100Ω, like the fuse element H12. On the other hand, when the fuse element H22 is disconnected, the resistance across the fuse element H22 is about 1 MΩ, like the fuse element H12. The fuse element H22 is made of material generally used for a fuse element, for example, polysilicon or aluminum (Al).

The transistor N12a has a drain terminal D connected to the other end of the fuse element H12 and a gate terminal G connected to the other end of the fuse element H22. The transistor N12b has a drain terminal D connected to the other end of the fuse element H22 and a gate terminal G connected to the other end of the fuse element H12. Here, a node at the connection point between the other end of the fuse element H22 and the drain terminal D of the transistor N12b is referred to as a node Nd22.

The fuse circuit 22 is driven when the control signal S1 output from the control part 1 is applied to the gate terminal G of the transistor N12, and outputs a fuse signal HS22 whose signal level is determined based on a state of the fuse element H12 and fuse element H22 included in the fuse circuit 22. Here, the signal level of the fuse signal HS22 is the electric potential of the node Nd22 at the connection point between the other end of the fuse element H22 and the drain terminal D of the transistor N12b, which is determined based on the magnitude relationship between the resistance of the fuse element H12 and the resistance of the fuse element H22.

In the fuse circuit 22, when the fuse element H12 is disconnected but the fuse element H22 is not disconnected, the resistance of the fuse element H12 is about 1 MΩ which is higher than the resistance of the fuse element H22 of 100Ω. Therefore, the electric potential of the node Nd22 has a level according to the power supply VDD and the fuse circuit 22 outputs the fuse signal HS22 of a high level at about 5 V. In addition, in the fuse circuit 22, when the fuse element H12 is not disconnected and the fuse element H22 is disconnected, the resistance of the fuse element H22 is about 1 MΩ which is higher than the resistance of the fuse element H12 of 100Ω. Therefore, the electric potential of the node Nd22 has a level according to the power supply VSS and the fuse circuit 22 outputs the fuse signal HS22 of a low level at about 0 V.

The write control part 4a includes a transistor N4a as a fifth NMOS transistor. The transistor N4a has a drain terminal D connected to the node Nd22, a gate terminal G connected to the control part 1, and a source terminal S connected to the power supply VSS. The transistor N4a is turned on and off based on a write control signal KS1a input from the control part 1 to the gate terminal G of the transistor N4a. When the transistor N4a is turned on, a write current KI1a is flown from the power supply VDD into the fuse element H22 and the fuse element H22 is disconnected according to a current value controlled by the transistor N4a. In other words, the transistor N4a performs control for disconnecting the fuse element H22 by flowing the write current KI1a into the fuse element H22.

Next, an operation until the signal level of the fuse signal HS22 output from the fuse circuit 22 is determined, in a case where the fuse element H12 is disconnected but the fuse element H22 is not disconnected under an output determination mode of determining the output signal SS1 of the memory circuit 10e illustrated in FIG. 12, will be described.

In the fuse circuit 22, when the voltage of the power supply VDD becomes a rated voltage of, for example, 5 V and the control signal S1 of a high level is supplied from the control part 1 to the gate terminal G of the transistor N12, the transistor N12 is turned on to start driving of the fuse circuit 22. Since the resistance of the fuse element H12 is about 1 MΩ as the fuse element H12 is disconnected, the electric potential of the node Nd22 has a high level at about 5 V as the node Nd22 receives the voltage of the power supply VDD via the fuse element H22.

When the node Nd22 has the high level, since a voltage of a high level is applied to the gate terminal G of the transistor N12a, the transistor N12a is turned on. Thus, the electric potential of the node Nd12a has a low level at about 0 V as the node Nd12a receives the voltage of the power supply VSS via the transistor N12a and the transistor N12.

When the electric potential of the node Nd12a has the low level, since a voltage of a low level is applied to the gate terminal G of the transistor N12b, the transistor N12b is turned off. Thus, since the node Nd22 is electrically disconnected from the power supply VSS, the electric potential of the node Nd22 maintains a high level. Therefore, the fuse signal HS22 of a high level is stably output from the fuse circuit 22.

Next, an operation until the signal level of the fuse signal HS22 output from the fuse circuit 22 is determined, in a case where the fuse element H12 is not disconnected and the fuse element H22 is disconnected under the output determination mode of determining the output signal SS1 of the memory circuit 10e illustrated in FIG. 12, will be described.

In the fuse circuit 22, when the voltage of the power supply VDD becomes a rated voltage of 5 V and the control signal S1 of a high level is supplied from the control part 1 to the gate terminal G of the transistor N12, the transistor N12 is turned on to start driving of the fuse circuit 22. Since the resistance of the fuse element H12 is 100Ω as the fuse element H12 is not disconnected, the electric potential of the node Nd12a has a high level at about 5 V as the node Nd12a receives the voltage of the power supply VDD via the fuse element H12.

When the node Nd12a has the high level, since a voltage of a high level is applied to the gate terminal G of the transistor N12b, the transistor N12b is turned on. Thus, the electric potential of the node Nd22 has a low level at about 0 V as the node Nd22 receives the voltage of the power supply VSS via the transistor N12b and the transistor N12.

When the electric potential of the node Nd22 has the low level, since a voltage of a low level is applied to the gate terminal G of the transistor N12a, the transistor N12a is turned off. Thus, since the node Nd12a is electrically disconnected from the power supply VSS, the potential of the node Nd12a maintains a high level and the transistor N12b is stably turned on. Therefore, the electric potential of the node Nd22 is stabilized at the low level and the fuse signal HS22 of a low level is stably output from the fuse circuit 22.

As described above, according to the memory circuit 10e of the fifth embodiment, the fuse circuit 22 includes the fuse elements H12 and H22 having the same resistance and the signal level of the fuse signal HS22 is determined based on the disconnect state of the fuse elements H12 and H22. When the fuse element H12 or the fuse element H22 is disconnected, the fuse element H12 or the fuse element H22 may not be fully disconnected or be damaged. Even in this case, there occurs a difference in resistance between the fuse element H12 and the fuse element H22, thereby making it possible to easily obtain the fuse signal HS22 of a desired signal level, in addition to the effects obtained in the fourth embodiment. As a result, it is possible to suppress an increase in time required for the output determination mode and further quickly use a product equipped with the memory circuit 10e after being powered on.

The configuration of the holding part 3b in each of the embodiments according to the present disclosure is not limited to those illustrated in FIGS. 2, 5 and 8 but may be applied to other different circuits as long as the circuits can hold the fuse transmission signal HDS1.

Although it has been illustrated in the above embodiments of the present disclosure that the fuse element H1, H12 or H22 is disconnected by a current using the write control part 4 or 4a, the disconnecting method is not limited thereto and a laser or the like may be used to disconnect these fuse elements. In this case, the write control part 4 or 4a is unnecessary, and thus the circuit area of the memory circuits 10a to 10e can be saved.

The memory circuits according to the present disclosure have high industrial applicability, because it is possible to suppress an increase in time required for the output determination mode and further quickly use products equipped with the memory circuits after being powered on.

According to the present disclosure, a product equipped with the memory circuit can reach a usable state quickly after being powered on.

While certain embodiments have been described, these embodiments have been presented by way of example only, and are not intended to limit the scope of the disclosures. Indeed, the novel methods and apparatuses described herein may be embodied in a variety of other forms; furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A memory circuit comprising:
   a control part configured to output a control signal;
   a fuse circuit which is driven by the control signal and is configured to output a fuse signal having a signal level determined based on a state of a first fuse element; and
   a holding circuit configured to update and hold a signal based on the fuse signal in response to the control signal output from the control part and to output the held signal as an output signal,
   wherein the fuse circuit further includes a first switch element configured to control driving of the fuse circuit based on the control signal, the first switch element having a resistance component,
   wherein the signal level of the fuse signal is determined based on a magnitude relationship between a resistance of the first fuse element and a resistance of the first switch element,
   wherein the first fuse element has one end connected to a first power supply,
   wherein the first switch element has one end connected to the other end of the first fuse element, the other end connected to a second power supply having an electric potential lower than an electric potential of the first power supply, and a control terminal connected to the control part,
   wherein the signal level of the fuse signal is determined based on an electric potential of a first node which is a connection point between the first fuse element and the first switch element, and
   wherein the driving of the fuse circuit is performed as the first switch element is turned on and off based on the control signal supplied to the control terminal of the first switch element.

2. The memory circuit of claim 1, wherein in response to the control signal, the fuse circuit stops outputting the fuse signal and the holding circuit stops updating the signal based on the fuse signal.

3. The memory circuit of claim 1, wherein the holding circuit includes:
   a holding control part configured to perform a transmission control for transmitting the signal based on the fuse signal output from the fuse circuit in response to the control signal; and
   a holding part configured to hold the signal based on the fuse signal transmitted under the transmission control of the holding control part and output the held signal as the output signal.

4. The memory circuit of claim 3, wherein the holding circuit includes a buffer part configured to receive the fuse signal output from the fuse circuit, generate a fuse transmission signal based on the signal level of the fuse signal, and output the generated fuse transmission signal to the holding control part.

5. The memory circuit of claim 3, wherein the holding circuit includes a buffer part configured to receive the fuse signal output from the fuse circuit, generate a fuse transmission signal based on a signal level of the fuse signal, and output the generated fuse transmission signal to the holding part.

6. The memory circuit of claim 5, wherein the holding control part includes a first control switch connected to the buffer part, the first control switch having a control terminal connected to the control part; and
   wherein driving of the buffer part is controlled by turning-on and turning-off of the first control switch.

7. The memory circuit of claim 1, further comprising a first NMOS transistor configured to perform a control to disconnect the first fuse element by flowing a write current into the first fuse element, the first NMOS transistor having a drain terminal connected to the first node.

8. The memory circuit of claim 1, further comprising:
   a second NMOS transistor having a drain terminal connected to the first node; and
   a current measuring part connected to a source terminal of the second NMOS transistor,
   wherein a disconnect state of the first fuse element is verified by measuring a verification current flown when the second NMOS transistor is turned on, using the current measuring part.

9. A memory circuit comprising:
   a control part configured to output a control signal;
   a fuse circuit which is driven by the control signal and is configured to output a fuse signal having a signal level determined based on a state of a first fuse element; and
   a holding circuit configured to update and hold a signal based on the fuse signal in response to the control signal output from the control part and to output the held signal as an output signal,
   wherein the fuse circuit includes a first resistor,
   wherein the signal level of the fuse signal is determined based on a magnitude relationship between a resistance of the first fuse element and a resistance of the first resistor,
   wherein the fuse circuit further includes a third NMOS transistor, a fourth NMOS transistor and a second switch element,
   wherein the first fuse element has one end connected to a first power supply,
   wherein the first resistor has one end connected to the one end of the first fuse element and to the first power supply,
   wherein the third NMOS transistor has a drain terminal connected to the other end of the first fuse element and a gate terminal connected to the other end of the first resistor,
   wherein the fourth NMOS transistor has a drain terminal connected to the other end of the first resistor and a gate terminal connected to the other end of the first fuse element,
   wherein the second switch element has one end connected to source terminals of the third and fourth NMOS transistors and a control terminal connected to the control part,
   wherein the signal level of the fuse signal is determined based on an electric potential of a third node which is a connection point between the first resistor and the drain terminal of the fourth NMOS transistor, and wherein driving of the fuse circuit is performed as the second switch element is turned on and off based on the control signal supplied to the control terminal of the second switch element.

10. The memory circuit of claim 9, wherein the resistance of the first resistor is determined independently from an electric potential of a fourth node which is a connection point between the first fuse element and the drain terminal of the third NMOS transistor.

11. The memory circuit of claim 10, wherein the first resistor is a resistive element, an impurity resistor, or a PMOS transistor having a gate terminal set to be turned on at all times.

12. The memory circuit of claim 10, wherein the first resistor is a second fuse element.

13. The memory circuit of claim 12, wherein the first and second fuse elements have the same resistance when the first and second fuse elements have the same size.

14. The memory circuit of claim 12, further comprising a fifth NMOS transistor configured to perform a control to disconnect the second fuse element by flowing a write current into the second fuse element, the fifth NMOS transistor having a drain terminal connected to the third node.

15. The memory circuit of claim 10, further comprising a first NMOS transistor configured to perform a control to disconnect the first fuse element by flowing a write current into the first fuse element, the first NMOS transistor having a drain terminal connected to the fourth node.

16. The memory circuit of claim 10, further comprising:
a second NMOS transistor having a drain terminal connected to the third node; and
a current measuring part connected to a source terminal of the second NMOS transistor, wherein a disconnect state of the first fuse element is verified by measuring a verification current flown when the second NMOS transistor is turned on, using the current measuring part.

* * * * *